(12) United States Patent
Miyake et al.

(10) Patent No.: US 12,019,103 B2
(45) Date of Patent: Jun. 25, 2024

(54) POWER MEASUREMENT APPARATUS AND POWER MEASUREMENT METHOD

(71) Applicants: DAIKIN INDUSTRIES, LTD., Osaka (JP); National Institute of Advanced Industrial Science and Technology, Tsukuba (JP)

(72) Inventors: Yuka Miyake, Osaka (JP); Hiroshi Dohmae, Osaka (JP); Akio Suzuki, Tsukuba (JP); Jun Fujimoto, Tsukuba (JP)

(73) Assignees: Daikin Industries, Ltd., Osaka (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 175 days.

(21) Appl. No.: 17/614,630

(22) PCT Filed: May 29, 2020

(86) PCT No.: PCT/JP2020/021380
§ 371 (c)(1),
(2) Date: Nov. 29, 2021

(87) PCT Pub. No.: WO2020/241834
PCT Pub. Date: Dec. 3, 2020

(65) Prior Publication Data
US 2022/0229096 A1 Jul. 21, 2022

(30) Foreign Application Priority Data
May 31, 2019 (JP) .................... 2019-101927

(51) Int. Cl.
*G01R 21/06* (2006.01)
*G01R 15/16* (2006.01)
*G01R 21/133* (2006.01)

(52) U.S. Cl.
CPC .............. *G01R 21/06* (2013.01); *G01R 15/16* (2013.01); *G01R 21/133* (2013.01)

(58) Field of Classification Search
CPC ....... G01R 15/16; G01R 21/06; G01R 21/133
See application file for complete search history.

(56) References Cited

U.S. PATENT DOCUMENTS 6,140,928 A * 10/2000 Shibuya ................ H01M 10/48
324/426
2015/0145500 A1 5/2015 Oshima et al.
(Continued)

FOREIGN PATENT DOCUMENTS

CN 101471663 A 7/2009
JP 6-28748 A 4/1994
(Continued)

OTHER PUBLICATIONS

1 European Search Report of corresponding EP Application No. 20 81 3140.9 dated Jun. 29, 2022.
(Continued)

*Primary Examiner* — Alvaro E Fortich
*Assistant Examiner* — Adam S Clarke
(74) *Attorney, Agent, or Firm* — Global IP Counselors, LLP

(57) ABSTRACT

A power measurement apparatus includes a voltage detector, current detector, and power calculator. The voltage detector contactlessly detects an AC voltage of a conductive path to which power is supplied from an AC power source having a magnitude of AC voltage regulated to be a predetermined value, and outputs a first data signal regarding a voltage (Continued)

waveform of the AC voltage of the conductive path. The current detector contactlessly detects an AC current flowing through the conductive path, and outputs a second data signal regarding a current waveform of the AC current of the conductive path. A power calculator receives the first and second data signals, and calculates active power of the conductive path from a product of a second instantaneous voltage and an instantaneous current of the current waveform indicated by the second data signal. The second instantaneous voltage is generated by converting a first instantaneous voltage.

10 Claims, 17 Drawing Sheets

(56) References Cited

U.S. PATENT DOCUMENTS

2015/0331025 A1    11/2015    Arashima et al.
2017/0012589 A1*    1/2017    Wang .................. H03F 3/45475
2017/0264295 A1*    9/2017    Slattery ............ G01R 31/31712

FOREIGN PATENT DOCUMENTS

| JP | 2006-343109 A | 12/2006 |
| JP | 2014-44170 A | 3/2014 |
| JP | 2014-119384 A | 6/2014 |
| JP | 2015-135319 A | 7/2015 |
| JP | 2017-49259 A | 3/2017 |
| JP | 6305236 B2 | 3/2018 |

OTHER PUBLICATIONS

International Preliminary Report of corresponding PCT Application No. PCT/JP2020/021380 dated Dec. 9, 2021.
International Search Report of corresponding PCT Application No. PCT/JP2020/021380 dated Sep. 1, 2020.

* cited by examiner

POWER MEASUREMENT APPARATUS AND POWER MEASUREMENT METHOD

CROSS-REFERENCE TO RELATED APPLICATIONS

This U.S. National stage application claims priority under 35 U.S.C. § 119(a) to Japanese Patent Application No. 2019-101927, filed in Japan on May 31, 2019, the entire contents of which are hereby incorporated herein by reference.

BACKGROUND

Field of the Invention

A power measurement apparatus and a power measurement method for measuring power supplied from an AC power source through a conductive path in such a manner as not to come into contact with the conductive path.

Background Information

For example, as described in Japanese Unexamined Patent Application Publication No. 2006-343109, there has been known a power measurement apparatus in which a detection electrode is arranged in a contactless manner near an electric wire to which a power supply voltage is applied to detect a voltage waveform of the electric wire and measure power. The power measurement apparatus described in Japanese Unexamined Patent Application Publication No. 2006-343109 has a configuration in which the electric wire and a probe are connected by capacitive coupling to enable measurement of the voltage waveform even in a contactless way.

SUMMARY

In the power measurement apparatus described in Japanese Unexamined Patent Application Publication No. 2006-343109, however, a distortion of a voltage or a current of the conductive path, which is the measurement target, causes a reduction in the measurement accuracy of power to be measured. In addition, there is a case where fluctuations in the relationship between the voltage generated in the electric wire and the voltage generated in the probe with fluctuations in coupling between the electric wire and the probe cause a reduction in the measurement accuracy of power in the power measurement apparatus in Japanese Unexamined Patent Application Publication No. 2006-343109.

A power measurement apparatus for measuring power supplied through a conductive path in such a manner as not to come into contact with the conductive path has to address improving measurement accuracy.

A power measurement apparatus according to a first aspect includes a voltage detector, a current detector, and a power calculator. The voltage detector detects in a contactless manner an AC voltage of a conductive path to which power is supplied from an AC power source whose magnitude of AC voltage is regulated to be a predetermined value, and outputs first data signal regarding a voltage waveform of the AC voltage of the conductive path. The current detector detects in a contactless manner an AC current flowing through the conductive path, and outputs second data signal regarding a current waveform of the AC current of the conductive path. The power calculator receives the first data signal and the second data signal and calculates active power of the conductive path from a product of a second instantaneous voltage and an instantaneous current of the current waveform indicated by the second data signal, the second instantaneous voltage being generated by converting a first instantaneous voltage of the voltage waveform indicated by the first data signal on the basis of the predetermined value.

In the power measurement apparatus according to the first aspect, with the use of a regulated predetermined value, the influence of contactless detection of an AC voltage on power calculation can be suppressed, and, in addition, calculating the active power from the product of the second instantaneous voltage and the instantaneous current can take the influence of the harmonics into account. Thus, power measurement accuracy is improved.

A power measurement apparatus according to a second aspect is the power measurement apparatus according to the first aspect, in which the predetermined value is an effective value or a peak value of the AC voltage of the AC power source, and, in calculation of the active power of the conductive path, the power calculator converts the first instantaneous voltage into the second instantaneous voltage on the basis of a ratio of an effective value or a peak value indicated by the voltage waveform to the predetermined value.

In the power measurement apparatus according to the second aspect, a change in the ratio of the effective value or the peak value indicated by the voltage waveform to the predetermined value, which is caused by an environmental change around the conductive path, can be reflected in the harmonics, and power measurement accuracy can be improved.

A power measurement apparatus according to a third aspect includes a voltage detector, a current detector, and a power calculator. The voltage detector detects in a contactless manner an AC voltage of a conductive path to which power is supplied from an AC power source whose magnitude of the AC voltage is regulated to be a predetermined value, and outputs first data signal regarding a voltage waveform of the voltage of the conductive path. The current detector detects in a contactless manner an AC current flowing through the conductive path and outputs second data signal regarding a current waveform of the current of the conductive path. The power calculator receives the first data signal and the second data signal and calculates active power of the conductive path from a magnitude of an AC current of the current waveform indicated by the second data signal, the predetermined value, and a phase difference between a fundamental of the voltage waveform obtained from the first data signal and a fundamental of the current waveform obtained from the second data signal.

In the power measurement apparatus according to the third aspect, with the use of a regulated predetermined value, even if harmonics are superimposed on a voltage, the influence of the harmonics on power calculation can be suppressed. In addition, with the use of the fundamental of the current waveform for the phase difference, an error of the phase difference due to noise can be suppressed. Thus, power measurement accuracy is improved.

A power measurement apparatus according to a fourth aspect is the power measurement apparatus according to any of the first aspect to the third aspect, in which the voltage detector includes a probe, an input part, a differential amplifier, and a regulator. The probe includes an electrode arranged so as not to come into contact with the conductive path, and generates an impedance including a capacitive component between the conductive path and the electrode. The input part is connected to the probe and produces an input signal corresponding to a waveform of an AC voltage of the conductive path on the basis of a potential of the electrode. The differential amplifier amplifies the input signal produced by the input part and outputs an output signal, the output signal being the first data signal. The regulator regulates at least one of a gain of the differential amplifier and a magnitude of the input signal produced by the input part on the basis of a magnitude of the output signal of the differential amplifier, and keeps the magnitude of the output signal of the differential amplifier within a predetermined range.

In the power measurement apparatus according to the fourth aspect, even if the impedance greatly changes with a change in surrounding environment and the potential of the electrode greatly changes, the regulator can keep the magnitude of the output signal of the differential amplifier within a predetermined range. As a result, a decrease in the resolution of the voltage waveform of the AC power supply voltage to be measured by a contactless voltage measurement circuit is suppressed.

A power measurement apparatus according to a fifth aspect is the power measurement apparatus according to the fourth aspect, in which the conductive path includes a first electric wire and a second electric wire. The probe includes, as the electrode, a first electrode arranged so as not to come into contact with the first electric wire and a second electrode arranged so as not to come into contact with the second electric wire, generates a first impedance including a capacitive component between the first electric wire and the first electrode, and generates a second impedance including a capacitive component between the second electric wire and the second electrode. The input part produces an input signal corresponding to a waveform of a potential difference between the first electrode and the second electrode.

In the power measurement apparatus according to the fifth aspect, even if the impedance greatly changes with a change in surrounding environment and the potential difference generated between the first electrode and the second electrode greatly changes, the regulator can keep the magnitude of the output signal of the differential amplifier within a predetermined range.

A power measurement apparatus according to a sixth aspect is the power measurement apparatus according to the fourth aspect or the fifth aspect, in which the regulator is configured such that a magnitude of the output signal of the differential amplifier obtained when the gain is regulated to a minimum is allowed to be smaller than one half of a magnitude of the output signal of the differential amplifier obtained when the gain is regulated to a maximum.

In the power measurement apparatus according to the sixth aspect, even in a case where the input signal of the differential amplifier greatly changes by a factor of two or more in response to a change in surrounding environment, the regulator can keep the magnitude of the output signal of the differential amplifier within a predetermined range.

A power measurement apparatus according to a seventh aspect is the power measurement apparatus according to any of the fourth aspect to the sixth aspect, in which the regulator is a programmable resistor that changes a resistance value determining the gain of the differential amplifier on the basis of the magnitude of the output signal of the differential amplifier.

In the power measurement apparatus according to the seventh aspect, the programmable resistor makes it easy to perform control to keep the magnitude of the output signal of the differential amplifier within a predetermined range.

A power measurement apparatus according to an eighth aspect is the power measurement apparatus according to any of the fourth aspect to the sixth aspect, in which the input part includes a voltage divider circuit connected to the electrode to divide an AC power supply voltage of the conductive path. The voltage divider circuit includes at least one of a variable capacitor and a variable resistor that are regulated by the regulator to change the magnitude of the input signal.

In the power measurement apparatus according to the eighth aspect, at least one of the variable capacitor and the variable resistor makes it easy to perform control to keep the magnitude of the output signal of the differential amplifier within a predetermined range.

A power measurement apparatus according to a ninth aspect is the power measurement apparatus according to any of the fourth aspect to the sixth aspect, in which the input part includes a voltage divider circuit connected to the electrode to divide an AC power supply voltage of the conductive path. The voltage divider circuit includes at least one of a variable capacitor and a variable resistor that are regulated by the regulator to change the magnitude of the input signal. The regulator includes a programmable resistor that changes a resistance value determining the gain of the differential amplifier on the basis of the magnitude of the output signal of the differential amplifier. The regulator is configured to change the resistance value of the programmable resistor and a value of the at least one of the variable capacitor and the variable resistor on the basis of the magnitude of the output signal of the differential amplifier.

In the power measurement apparatus according to the ninth aspect, the programmable resistor and at least one of the variable capacitor and the variable resistor make it easy to perform control to keep the magnitude of the output signal of the differential amplifier within a predetermined range.

A power measurement method according to a tenth aspect includes detecting in a contactless manner a voltage waveform of an AC voltage of a conductive path to which power is supplied from an AC power source whose magnitude of the AC voltage is regulated to be a predetermined value, detecting in a contactless manner a current waveform of an AC current flowing through the conductive path, converting a first instantaneous voltage indicated by the voltage waveform on the basis of the predetermined value to generate a second instantaneous voltage, and calculating active power of the conductive path from a product of the second instantaneous voltage and an instantaneous current indicated by the current waveform.

A power measurement method according to an eleventh aspect includes detecting in a contactless manner a voltage waveform of an AC voltage of a conductive path to which power is supplied from an AC power source whose magnitude of the AC voltage is regulated to be a predetermined value, detecting in a contactless manner a current waveform of an AC current flowing through the conductive path, calculating a magnitude of the AC current from the current waveform, calculating a phase difference between a fundamental of the current waveform and a fundamental of the voltage waveform, and calculating active power of the conductive path from the predetermined value, the magnitude of the AC current of the current waveform, and the phase difference between the fundamental of the current waveform and the fundamental of the voltage waveform.

DETAILED DESCRIPTION OF EMBODIMENT(S)

First Embodiment (1) Overall Configuration

Figure 1:
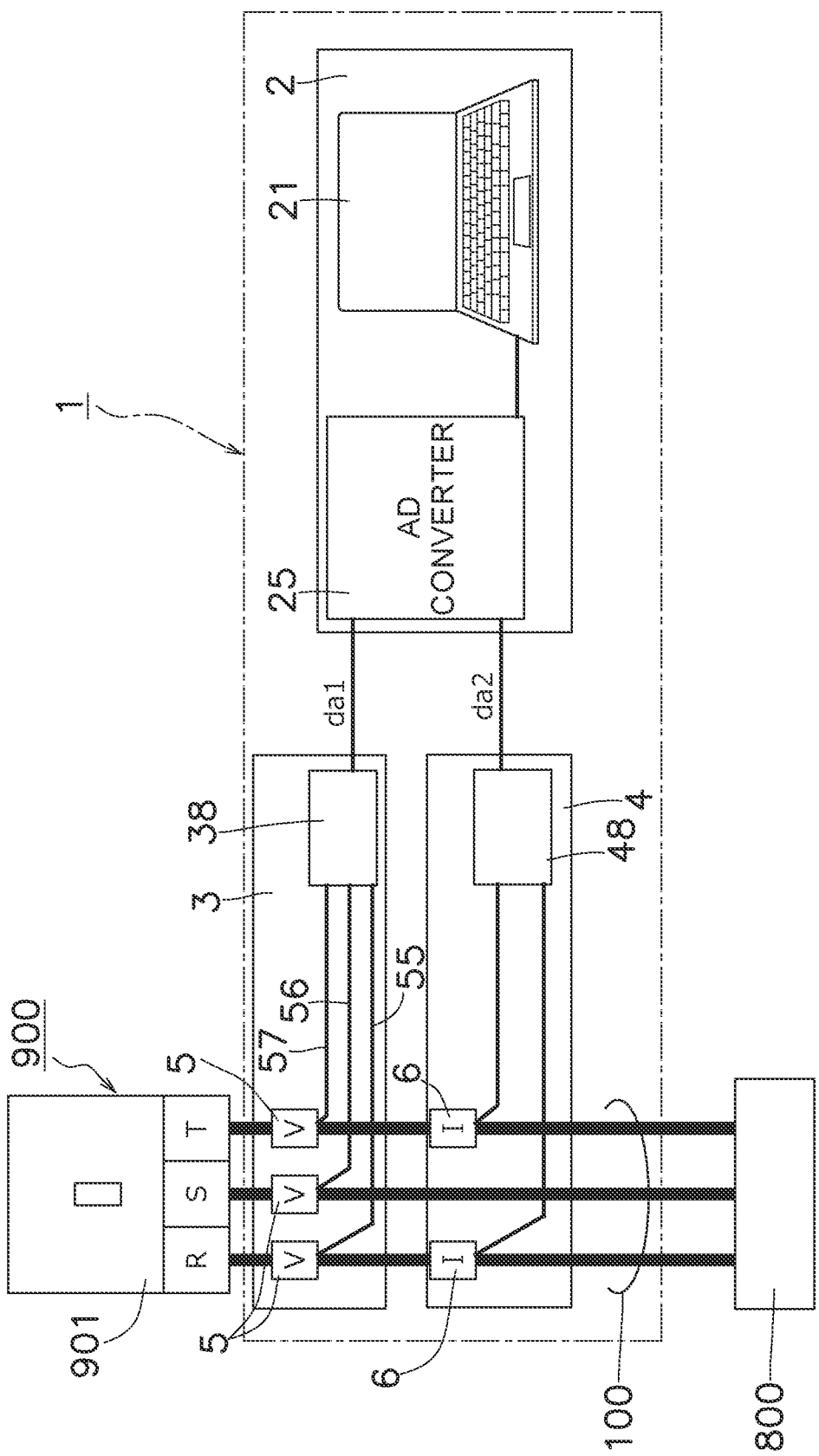
FIG. 1 is a schematic diagram illustrating an overview of the configuration of a power measurement apparatus according to a first embodiment and a relationship between the power measurement apparatus according to the first embodiment and a conductive path.

FIG. 1 illustrates a power measurement apparatus 1. The power measurement apparatus 1 is connected to a breaker 901 of an AC power source 900. The magnitude of the AC voltage of the AC power source 900 is regulated to be a predetermined value. The predetermined value is, for example, an effective value of 200 V. While a description will be given here using an effective value, the magnitude of the AC voltage is not limited to the effective value. The predetermined value may be regulated by, for example, a peak value. For example, the magnitude of the AC voltage of the AC power source 900 may be regulated to be a peak value of 282 V. In a first embodiment, a case where the alternating current of the AC power source 900 is a three-phase alternating current will be described as an example. However, the AC power source 900 may be configured to supply power by any other alternating current such as a two-phase alternating current.

The AC power source 900 is connected to a conductive path 100. The AC power source 900 supplies power to an air conditioner 800 through the conductive path 100. To be more specific, the conductive path 100 is connected to an outdoor unit of the air conditioner 800, and power is supplied to the outdoor unit through the conductive path 100.

The power measurement apparatus 1 measures the active power of the conductive path 100. For the power measurement of the conductive path 100, the power measurement apparatus 1 includes a voltage detector 3, a current detector 4, and a power calculator 2.

The voltage detector 3 detects in a contactless manner an AC voltage of the conductive path 100 to which power is supplied from the AC power source 900 whose magnitude of the AC voltage is regulated to be a predetermined value, and outputs first data signal da1 regarding the voltage waveform of the voltage of the conductive path 100. The voltage detector 3 includes probes 5 that detect in a contactless manner AC voltages of the conductive path 100. A voltage measurer 38 receives the AC voltages output from the probes 5 and outputs the first data signal da1 corresponding to the AC voltage of the conductive path 100. The current detector 4 detects in a contactless manner an AC current flowing through the conductive path 100, and outputs second data signal da2 regarding a current waveform. The current detector 4 includes a current transformer 6 that detects in a contactless manner an AC current flowing through the conductive path 100. A current measurer 48 receives the AC current, which has been transformed by the current transformer 6, and outputs the second data signal da2 corresponding to the AC current flowing in the conductive path 100.

The power calculator 2 receives the first data signal da1 output from the voltage detector 3, and receives the second data signal da2 output from the current detector 4. The power calculator 2 may not only directly receive the first data signal da1 and the second data signal da2 but also indirectly receive the content of the first data signal da1 and the second data signal da2. Examples of the case where the power calculator 2 indirectly receives the content of the first data signal da1 and the second data signal da2 include the following case. The first data signal da1 and the second data signal da2, which are output as analog signals, are converted into digital signals by an AD converter, and the AD converter directly outputs the first data signal da1 and the second data signal da2 as the digital signals to the power calculator 2. The power calculator 2 according to the first embodiment has an AD converter 25 incorporated therein. The power calculator 2 having such a configuration directly receives the analog first data signal da1 and the analog second data signal da2 output from the voltage detector 3 and the current detector 4, and the analog data signal is converted into digital data signal in the power calculator 2.

The power calculator 2 calculates the active power from the magnitude of the AC current, the magnitude of the AC voltage, and the phase difference between the AC current and the AC voltage. The power calculator 2 uses the magnitude indicated by the second data signal da2 as the magnitude of the AC current of the current waveform. The power calculator 2 uses the predetermined value of the AC power source 900 as the magnitude of the AC voltage. The power calculator 2 uses, as the phase difference, the phase difference between the fundamental of the voltage waveform obtained from the first data signal da1 and the fundamental of the current waveform obtained from the second data signal da2.

The power measurement apparatus 1 outputs the active power, which is calculated by the power calculator 2, as the active power of the conductive path 100.

(2) Detailed Configuration

The conductive path 100 includes a first electric wire 101, a second electric wire 102, and a third electric wire 103. The first electric wire 101 corresponds to the R phase of the AC power source 900, the second electric wire 102 corresponds to the S phase, and the third electric wire 103 corresponds to the phase.

(2-1) Voltage Detector 3

Figure 2:
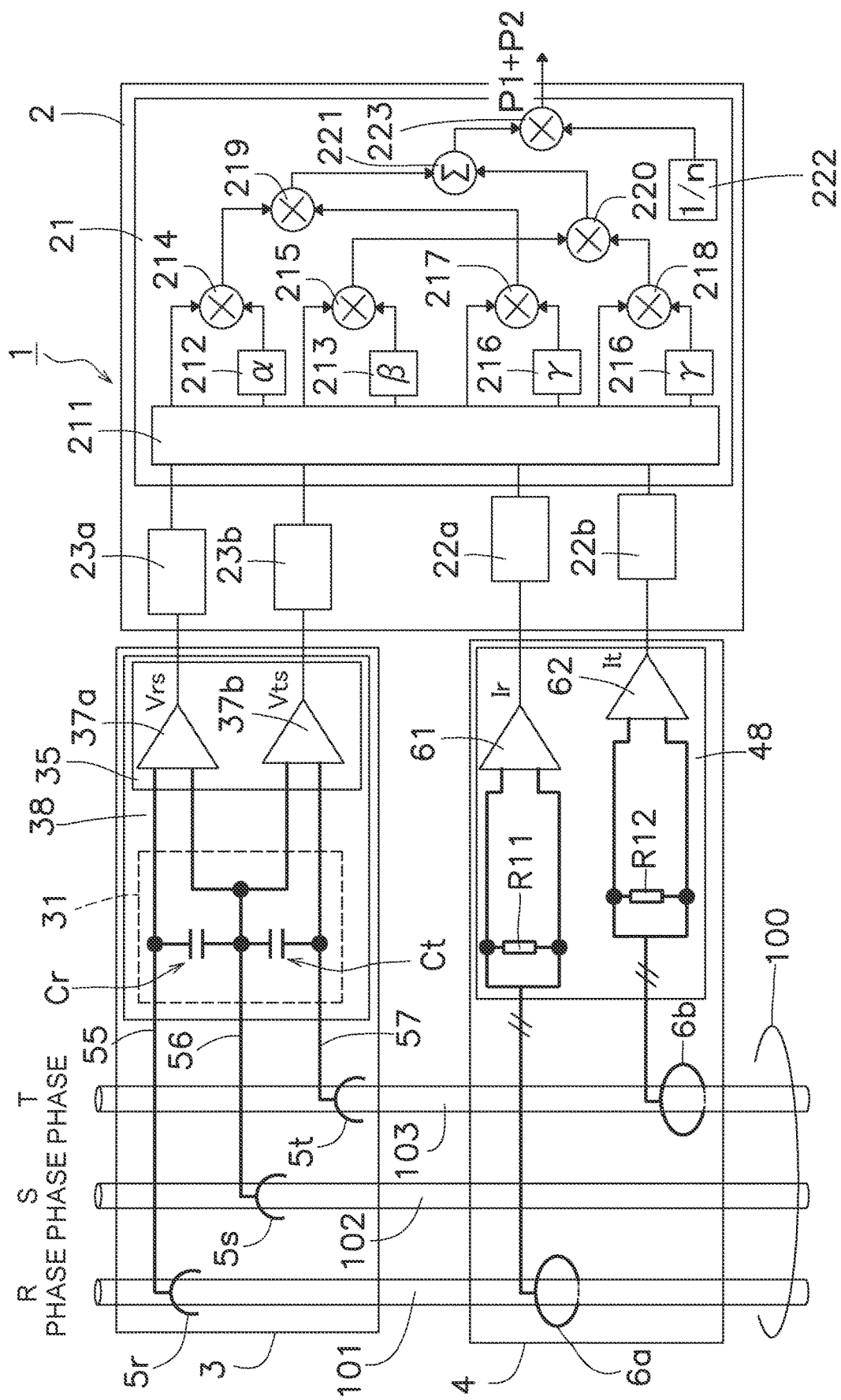
FIG. 2 is a circuit diagram illustrating an example of the configuration of the power measurement apparatus according to the first embodiment.

As illustrated in FIG. 2, the voltage detector 3 includes three probes 5r, 5s, and 5t and the voltage measurer 38. The voltage measurer 38 includes an input part 31 and a gain-adjustable amplifier unit 35. To clarify the correspondence relationships between the three probes illustrated in FIG. 1 and the R, S, and T phases, the probes 5 are given suffixes, like the probes 5r, 5s, and 5t illustrated in FIG. 2, to distinguish them.

Figure 3:
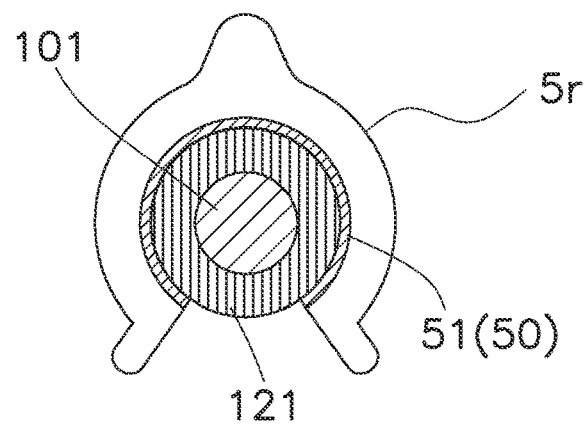
FIG. 3 includes cross-sectional views of three probes attached to the conductive path.
Figure 3:
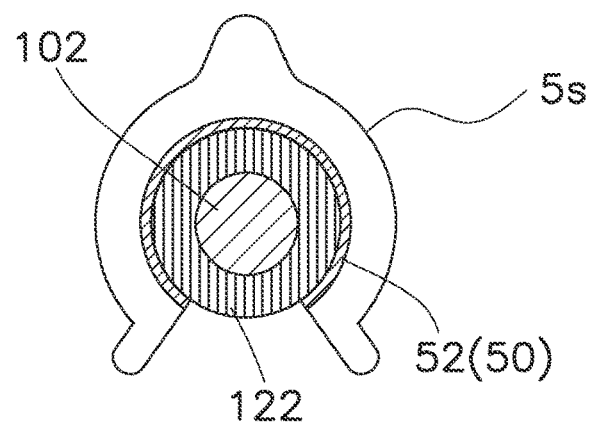
Figure 3:
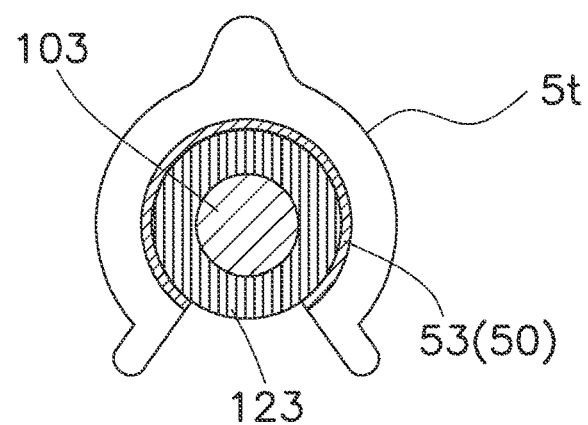

As illustrated in FIG. 3, the probe 5r is attached to the first electric wire 101 so that the first electric wire 101 with an insulating coating 121 is surrounded from above. Also, the probe 5s is attached to the second electric wire 102 so that the second electric wire 102 with an insulating coating 122 is surrounded from above, and the probe 5t is attached to the third electric wire 103 so that the third electric wire 103 with an insulating coating 123 is surrounded from above. A first electrode 51 of the probe 5r, a second electrode 52 of the probe 5s, and a third electrode 53 of the probe 5t are arranged on the outer periphery of the insulating coatings 121, 122, and 123, respectively. The insulating coatings 121, 122, and 123 are made of, for example, plastic or rubber.

Figure 4:
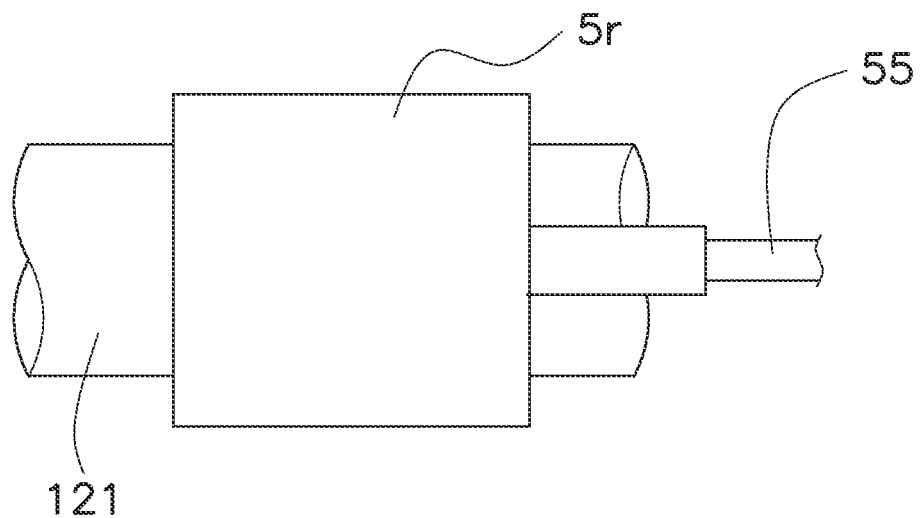
FIG. 4 is a plan view of a probe attached to a first electric wire.
Figure 5:
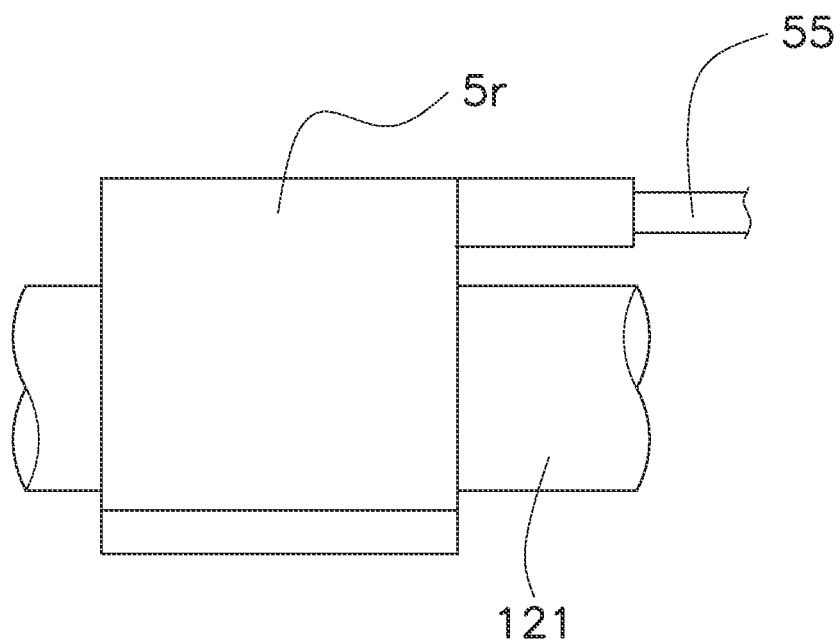
FIG. 5 is a side view of the probe attached to the first electric wire.

FIG. 4 and FIG. 5 illustrate the shapes of the probe 5r as viewed from above and as viewed from a side. Like the probe 5r, the shapes of the probes 5s and 5t are substantially rectangular when viewed from above and when viewed from a side. The probe 5r extends in a direction in which the insulating coating 121 extends. A wiring line 55 connected to the first electrode 51 is drawn out from the probe 5r. Wiring lines 56 and 57 illustrated in FIG. 1 and FIG. 2 are also connected to the second electrode 52 and the third electrode 53, respectively. The first electrode 51, the second electrode 52, and the third electrode 53 are included in an electrode 50 arranged so as not to come into contact with an electric wire to which an AC power supply voltage is applied.

The probes 5r, 5s, and 5t include the first electrode 51, the second electrode 52, and the third electrode 53 arranged so as not to come into contact with the first electric wire 101, the second electric wire 102, and the third electric wire 103 of the conductive path 100, respectively. The probes 5r, 5s, and 5t generate an impedance including a capacitive component between the conductive path 100 and the first electric wire 101, between the conductive path 100 and the second electric wire 102, and between the conductive path 100 and the third electric wire 103, respectively.

As illustrated in FIG. 2, the probes 5r, 5s, and 5t are connected to the input part 31 by the wiring lines 55 to 57, respectively. The input part 31 is configured to include, for example, capacitors Cr and Ct. An AC voltage corresponding to a phase-to-phase voltage generated between the first electric wire 101 and the second electric wire 102 is produced across the capacitor Cr. Likewise, an AC voltage corresponding to a phase-to-phase voltage generated between the third electric wire 103 and the second electric wire 102 is produced across the capacitor Ct.

Figure 6:
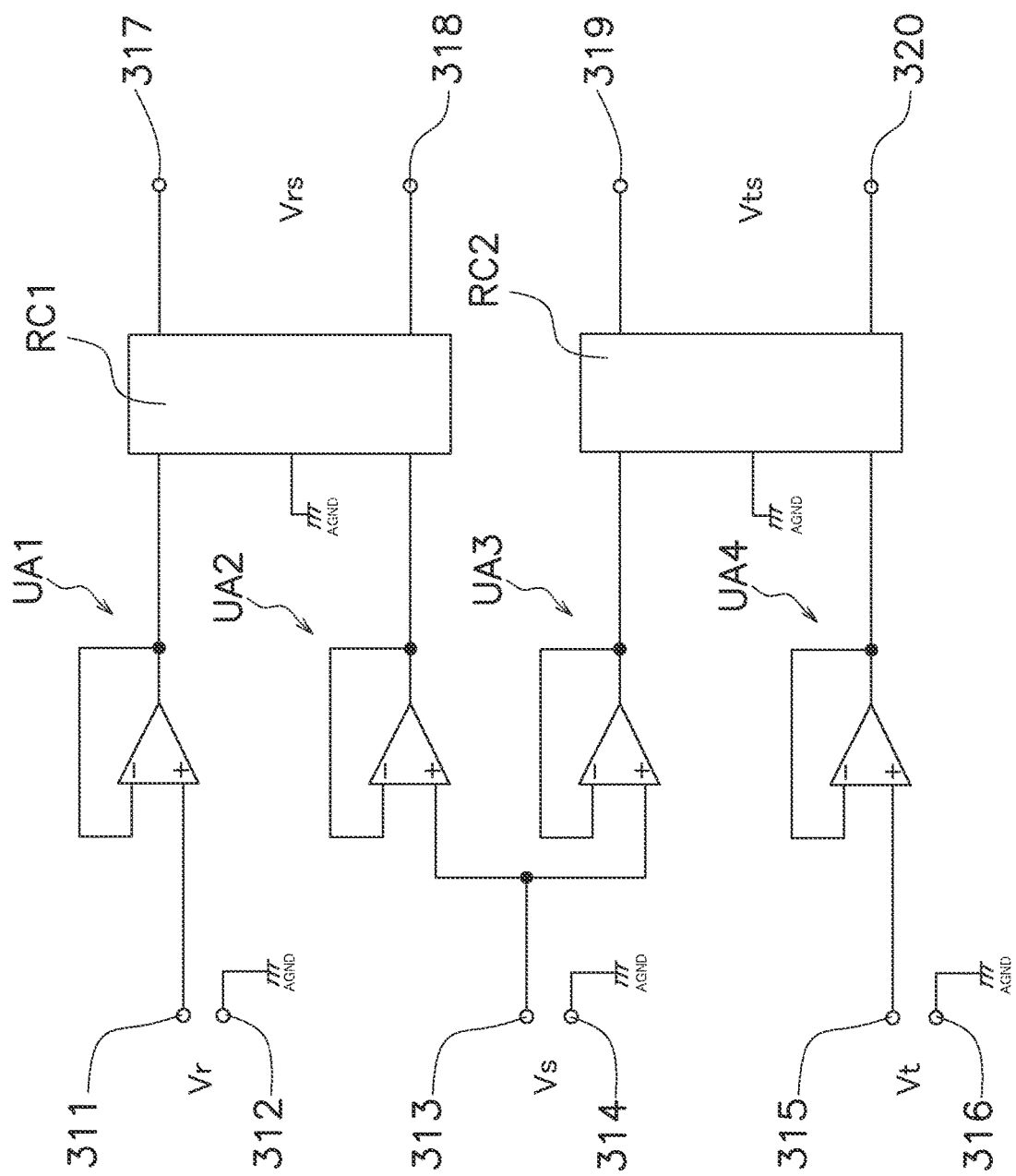
FIG. 6 is a circuit diagram for describing the configuration of an input part.

FIG. 6 illustrates an overview of another configuration of the input part 31. The input part 31 illustrated in FIG. 6 includes a first circuit RC1 and a second circuit RC2, each including a resistor and a capacitor, and unity gain operational amplifiers UA1 to UA4. The unity gain operational amplifier UA1 has input terminals 311 and 312 to which an AC voltage Vr generated between an analog ground AGND and the wiring line 55 of the probe 5r is input. The AC voltage Vr generated between the analog ground AGND and the wiring line 55 of the probe 5r is applied between the input terminals 311 and 312 of the unity gain operational amplifier UA1, The unity gain operational amplifiers UA2 and UA3 have input terminals 313 and 314 to which an AC voltage Vs generated between the analog ground AGND and the wiring line 57 of the probe 5s is applied. The unity gain operational amplifier UA4 has input terminals 315 and 316 to which an AC voltage Vt generated between the analog ground AGND and the wiring line 56 of the probe 5t is applied. The first circuit RC1 produces an AC voltage Vrs having a voltage waveform similar to that of the phase-to-phase voltage of the first electric wire 101 and the second electric wire 102 from the voltage Vr of the probe 5r output from the unity gain operational amplifier UA1 and the voltage Vs of the probe 5s output from the unity gain operational amplifier UA2, and outputs the AC voltage Vrs from output terminals 317 and 318. The second circuit RC2 produces an AC voltage Vts having a voltage waveform similar to that of the phase-to-phase voltage of the third electric wire 103 and the second electric wire 102 from the voltage Vt of the probe 5t output from the unity gain operational amplifier UA4 and the voltage Vs of the probe 5s output from the unity gain operational amplifier UA3, and outputs the AC voltage Vts from output terminals 319 and 320. Since the first circuit RC1 and the second circuit RC2 having such configurations can be implemented by a known circuit that is conventionally known, the description of the circuit configurations of the first circuit RC1 and the second circuit RC2 will be omitted here.

The amplitudes of the voltage waveforms of the AC voltages Vrs and Vts output from the input part 31 are affected by the surface areas of the probes 5r, 5s, and 5t, the thicknesses of the insulating coatings 121, 122, and 123, the thicknesses of the core wires of the first electric wire 101 to the third electric wire 103, dirt on the surfaces of the electric wires, the degree of adhesion of the probes 5r, 5s, and 5t, the ambient temperatures and humidities of the probes 5r, 5s, and 5t, and so on.

A voltage detection circuit constituting the input part 31 is capable of outputting a voltage waveform without distortion, but is incapable of detecting the absolute value of a voltage waveform. Accordingly, the amplitudes of the voltage waveforms of the AC voltages Vrs and Vts output from the input part 31 of the power measurement apparatus 1 are handled as specified values (for example, an effective value of 200 V).

Figure 7:
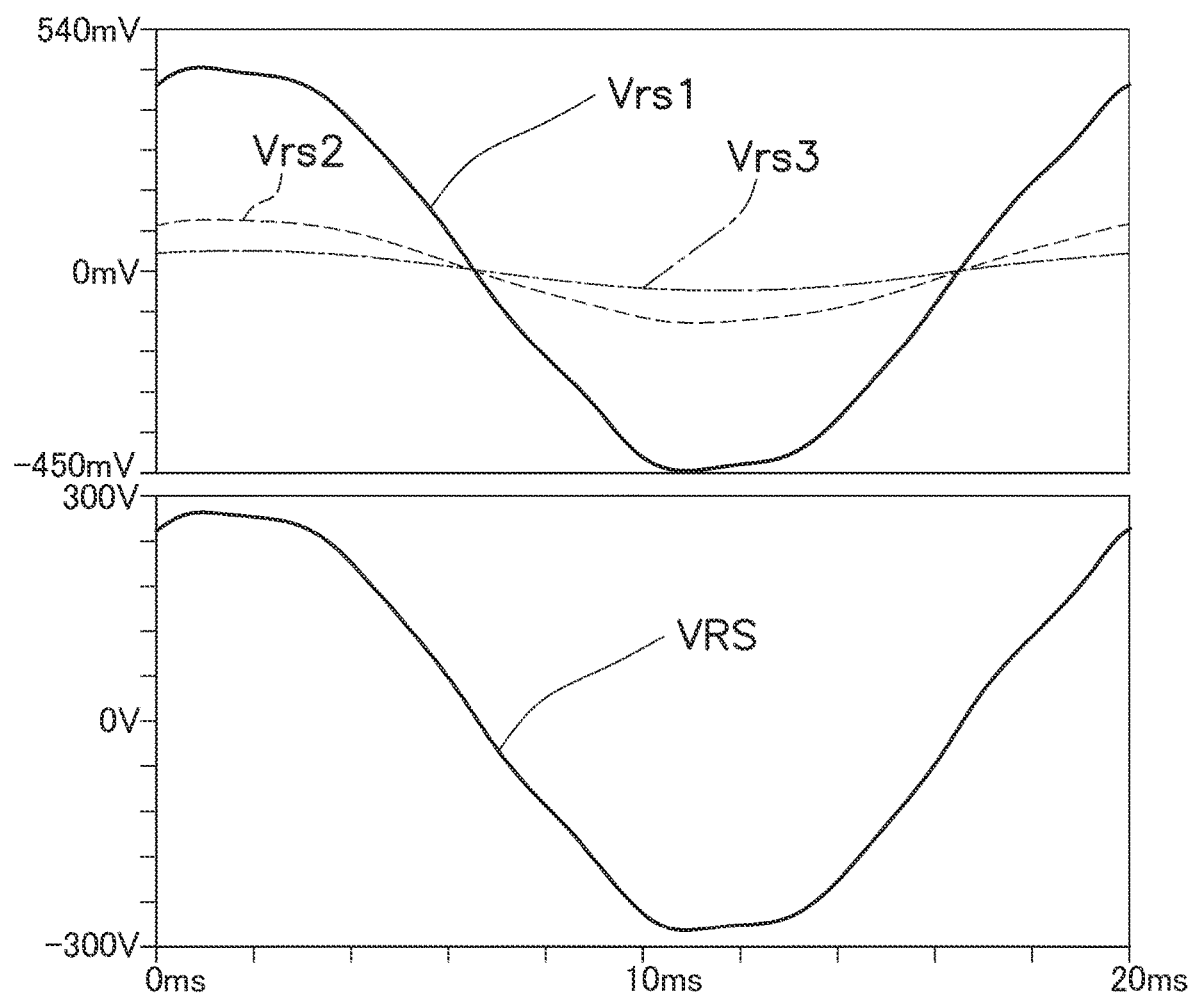
FIG. 7 is a graph for describing the magnitudes of AC voltages detected by the probes.

FIG. 7 illustrates various voltage waveforms Vrs1, Vrs2, and Vrs3 as AC voltages Vrs output from the input part 31, and a voltage waveform VRS having the same magnitude as a reference value (for example, AC 200 V). As illustrated in FIG. 7, even if the voltage waveform VRS is distorted due to superimposition of harmonics, the voltage waveforms Vrs1, Vrs2, and Vrs3 output from the input part 31 are similar to the distorted voltage waveform VRS.

The voltage waveforms of the AC voltages Vrs and Vts output from the input part 31 are amplified by amplifiers 37a and 37b whose gains can be changed, respectively. The amplifiers 37a and 37b are, for example, programmable gain amplifiers. Since the AD conversion error is large if the voltage waveforms output from the input part 31 are excessively small, the amplifiers 37a and 37b amplify the voltage waveforms output from the input part 31 to appropriate magnitudes to expand the voltage waveforms. The amplifiers 37a and 37b select the factor of amplification from among, for example, 2, 4, 8, 16, 32, and so on. If the voltage waveforms output from the input part 31 are excessively large, it is not possible to correctly convert the waveforms. Thus, the amplifiers 37a and 37b amplify the waveforms to appropriate magnitudes to compress the waveforms. The amplifiers 37a and 37b select the factor for amplification from among, for example, ½, ¼, ⅛, 1/16, 1/32, and so on. The outputs of the amplifiers 37a and 37b are input to AD converters 23a and 23b.

(2-2) Current Detector 4

The current detector 4 illustrated in FIG. 2 includes current transformers 6a and 6b and the current measurer 48. The current measurer 48 includes resistors R11 and R12 and amplifiers 61 and 62. The current transformer 6a is arranged so as not to come into contact with the first electric wire 101. The current transformer 6a transforms an AC current flowing in the first electric wire 101 and outputs an AC current having a different magnitude from that of the AC current of the first electric wire 101. The resistor R11 is connected to the current transformer 6a, and the AC current output from the current transformer 6a flows through the resistor R11. A voltage waveform having the same shape as that of the current waveform of the AC current output from the current transformer 6a is produced across the resistor R11. The amplifier 61 amplifies the voltage waveform across the resistor R11 to a magnitude such that the voltage waveform can be handled as the AC current of the first electric wire 101.

The current transformer 6b is arranged so as not to come into contact with the third electric wire 103. The current transformer 6b transforms an AC current flowing in the third electric wire 103 and outputs an AC current having a different magnitude from that of the AC current of the third electric wire 103. The resistor R12 is connected to the current transformer 6b, and the AC current output from the current transformer 6b flows through the resistor R12. A voltage waveform having the same shape as that of the current waveform of the AC current output from the current transformer 6b is produced across the resistor R12. The amplifier 62 amplifies the voltage waveform across the resistor R12 to a magnitude such that the voltage waveform can be handled as the AC current of the third electric wire 103.

(2-3) Power Calculator 2

The power calculator 2 includes AD converters 22a, 22b, 23a, and 23b and a power computation unit 21. The power calculator 2 can be implemented by, for example, a computer including an AD converter. For example, the computer executes a program to form the power computation unit 21 in a CPU of the computer. The AD converter 22a is connected to the amplifier 61, and the AD converter 22b is connected to the amplifier 62. The AD converter 22a, converts an instantaneous value of an analog signal indicating an AC current Ir output from the amplifier 61 into digital data signal. The AD converter 22b converts an instantaneous value of an analog signal indicating an AC current It output from the amplifier 62 into digital data signal. The magnitudes of the AC currents Ir and It indicated by the analog signals output from the amplifiers 61 and 62 are equal to the magnitudes of the AC currents output from the current transformers 6a and 6b, respectively. The analog signals output from the amplifiers 61 and 62 are the second data signal output from the current detector 4. The digital data signal regarding the magnitudes and the current waveforms of the AC currents output the current transformers 6a and 6b is output to a memory 211 of the power computation unit 21 through the AD converters 22a and 22b.

The AD converter 23a is connected to the amplifier 37a, and the AD converter 23b is connected to the amplifier 37b. The AD converters 23a and 23b convert instantaneous values of analog signals indicating the AC voltages Vrs and Vts output from the amplifiers 37a and 37b into digital data signal, respectively. The analog signals output from the amplifiers 37a and 37b are the first data signal output from the voltage detector 3. The digital data signal regarding the voltage waveform of the voltage generated between the first electric wire 101 and the second electric wire 102 and the voltage waveform of the voltage generated between the third electric wire 103 and the second electric wire 102 is output to the memory 211 of the power computation unit 21 through the AD converters 23a and 23b.

Ratio determiners 212 and 213 of the power computation unit 21 of the power calculator 2 determine ratios $\alpha$ and $\beta$ of effective values or peak values indicated by the voltage waveforms of the AC voltages Vrs and Vts to the predetermined value. For example, it is assumed that there are n pieces of digital data corresponding to two cycles of the AC voltage Vrs, namely; {Vrs(1), Vrs(2), Vrs(3), ..., Vrs(n−1), and Vrs(n)}. The root mean square of these n pieces of data is computed to determine an effective value $Vrs_{rms}$ of the AC voltage Vrs. Likewise, an effective value $Vts_{rms}$ of the AC voltage Vts is determined from n pieces of digital data {Vts(1), Vts(2), Vts(3), ..., Vts(n−1), Vts(n)} corresponding to two cycles of the AC voltage Vts. For example, if the predetermined value is an effective value of 200 V the predetermined value is divided by the effective value $Vrs_{rms}$ of the AC voltage Vrs to determine $\alpha$ ($\alpha=200/Vrs_{rms}$), and the predetermined value is divided by the effective value $Vts_{rms}$ of the AC voltage Vts to determine $\beta$ ($\beta=200/Vts_{rms}$).

Further, using a current conversion coefficient $\gamma$ determined by the current transformers 6a and 6b, if instantaneous values of the AC current flowing through the first electric wire 101 are n pieces of data {$\gamma$Ir(1), $\gamma$Ir(2), ..., $\gamma$Ir(n)} and instantaneous values of the AC current flowing through the third electric wire 103 are n pieces of data {$\gamma$It(1), $\gamma$It(2), ..., $\gamma$It(n)}, active power P is determined by the sum of P1 and P2 expressed by equation (1) and equation (2).

$$P1 = (1/n) \times \{\alpha Vr(1) \times \gamma Ir(1) + \alpha Vr(2) \times \gamma Ir(2) + \ldots + \alpha Vr(n) \times \gamma Ir(n)\} \quad (1)$$

$$P2 = (1/n) \times \{\beta Vt(1) \times \gamma It(1) + \beta Vt(2) \times \gamma It(2) + \ldots + \beta Vt(n) \times \gamma It(n)\} \quad (2)$$

While the effective value is used in the computation of the active power P described above, a peak value (for example, 282 V) of the predetermined value may be used instead of the effective value (for example, 200 V) of the predetermined value. For example, α is determined by 282/(the peak value of the AC voltage Vts).

A multiplier 214 illustrated in FIG. 2 multiplies an instantaneous value of the AC voltage Vrs stored in the memory 211 by the ratio α output from the ratio determiner 212. The multiplier 214 receives a value of a first instantaneous voltage and outputs a value of a second instantaneous voltage. A multiplier 215 multiplies an instantaneous value of the AC voltage Vts stored in the memory 211 by the ratio β output from the ratio determiner 213. The multiplier 215 receives a value of a first instantaneous voltage and outputs a value of a second instantaneous voltage. A coefficient output unit 216 outputs the current conversion coefficient γ stored in the memory 211. A multiplier 217 multiplies an instantaneous value of the AC current Ir stored in the memory 211 by the current conversion coefficient γ output from the coefficient output unit 216. A multiplier 218 multiplies an instantaneous value of the AC current It stored in the memory 211 by the current conversion coefficient γ output from the coefficient output unit 216. A multiplier 219 multiplies the value of the second instantaneous voltage output from the multiplier 214 by the value of the instantaneous current output from the multiplier 217. For example, the multiplier 219 performs computation of αVr(n)×γIr(n). A multiplier 220 multiplies the value of the second instantaneous voltage output from the multiplier 215 by the value of the instantaneous current output from the multiplier 218. For example, the multiplier 220 performs computation of βVt(n)×γIt(n). An accumulator 221 accumulates the n pieces of data output from the multiplier 219 and the n pieces of data output from the multiplier 220. A multiplier 223 multiplies the output of the accumulator 221 by a value of 1/n output from a coefficient output unit 222, and the value of the active power P(=P1+P2) is output from the multiplier 223.

(3) Overview of Power Measurement Method

Figure 8:
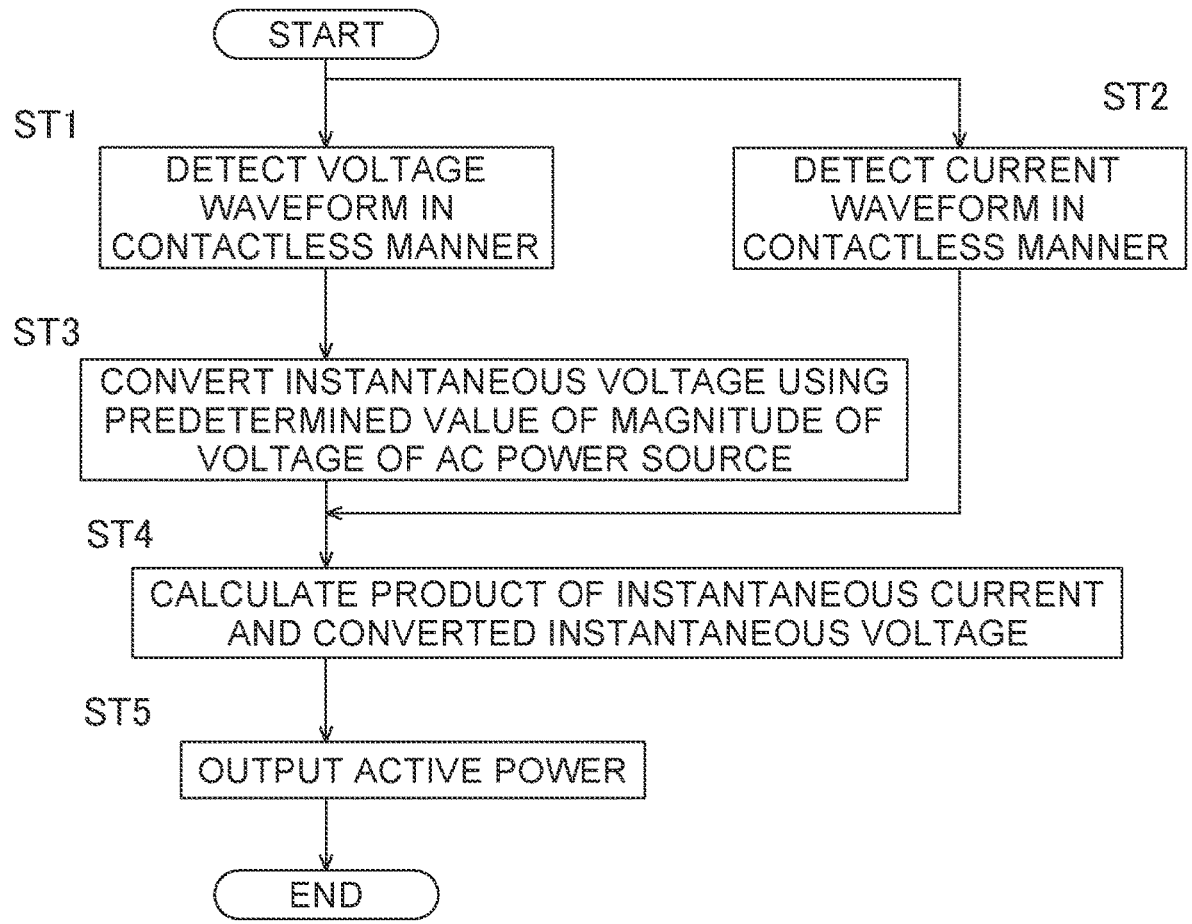
FIG. 8 is a flowchart illustrating how a power measurement method according to the first embodiment is performed.

An overview of a power measurement method will be described with reference to FIG. 8. First, the power measurement apparatus 1 detects in a contactless manner a voltage waveform of an AC voltage of the conductive path 100 to which power is supplied from the AC power source 900 whose magnitude of the AC voltage is regulated to be a predetermined value (step ST1). As described above, the voltage detector 3 detects the voltage waveform of the AC voltage in a contactless manner by using the probes 5r, 5s, and 5t, attached to the first electric wire 101, the second electric wire 102, and the third electric wire 103.

At the same time as the detection of the voltage waveform (step ST1), the power measurement apparatus 1 detects in a contactless manner a current waveform of an AC current flowing through the conductive path 100 (step ST2). As described above, the current detector 4 detects the current waveform of the AC current in a contactless manner by using the current transformers 6a and 6b attached to the first electric wire 101 and the third electric wire 103.

The power measurement apparatus 1 converts a first instantaneous voltage indicated by the voltage waveform on the basis of the predetermined value and generates a second instantaneous voltage (step ST3). As described above, in the first embodiment, the value provided to the multipliers 214, 215 is the value of the first instantaneous voltage. The value of the first instantaneous voltage is multiplied by the ratios α and β to calculate the value of the second instantaneous voltage, α and β are the ratios of effective values or peak values indicated by the voltage waveforms of the AC voltages Vrs and Vts to the predetermined value (effective value or peak value) of the AC voltage of the AC power source 900, respectively.

The power computation unit 21 calculates the active power of the conductive path 100 by using the product of the second instantaneous voltage and the instantaneous current (step ST4), The power measurement apparatus 1 outputs the active power of the conductive path 100 calculated by the power computation unit 21 (step ST5).

(4) Features 4-1

In the power measurement apparatus 1 or the power measurement method according to the first embodiment, with the use of a predetermined value regulated for the AC power source 900, the influence of contactless detection of an AC voltage using the probes 5r, 5s, and 5t, on power calculation can be suppressed. In the power measurement apparatus 1 according to the first embodiment, furthermore, since the active power is calculated using the product of the second instantaneous voltage and the instantaneous current, the influence of the harmonics can be taken into account. Thus, power measurement accuracy is improved.

4-2

In the power measurement apparatus 1 or the power measurement method according to the first embodiment, an environmental change around the conductive path 100 causes a change in the ratios α and β of the effective values or peak values indicated by the voltage waveforms to the predetermined value. For example, the magnitudes of the AC voltages output from the probes 5r, 5s, and 5t, change due to the ambient temperatures and humidities of the probes 5r, 5s, and 5t, or the like. Since the ratios α and β can be reflected even in the harmonics of the AC current, it is possible to improve the measurement accuracy of the active power output from the power measurement apparatus 1.

(5) Modifications (5-1) Modification 1A

In the first embodiment, a description has been given of a case where the AC power source 900 is configured to supply a three-phase alternating current. However, the application of the technique described in the first embodiment is not limited to an AC power source configured to supply a three-phase alternating current. For example, the technique described in the first embodiment is also applicable to an AC power source configured to supply a two-phase alternating current.

(5-2) Modification 1B

In the first embodiment, a method for determining the magnitude of an AC voltage by computation using digital data signal has been described. However, the method for determining the magnitude of an AC voltage is not limited to such a method. For example, a rectifier voltmeter may be used to detect the magnitude of an AC voltage. Alternatively, simply, the magnitude of the fundamental of an AC voltage including harmonics may be determined by FFT analysis, and the magnitude of the fundamental may be regarded as the magnitude of the AC voltage. FFT is an abbreviation for fast Fourier transform.

Second Embodiment (6) Overview of Power Measurement Apparatus

Figure 9:
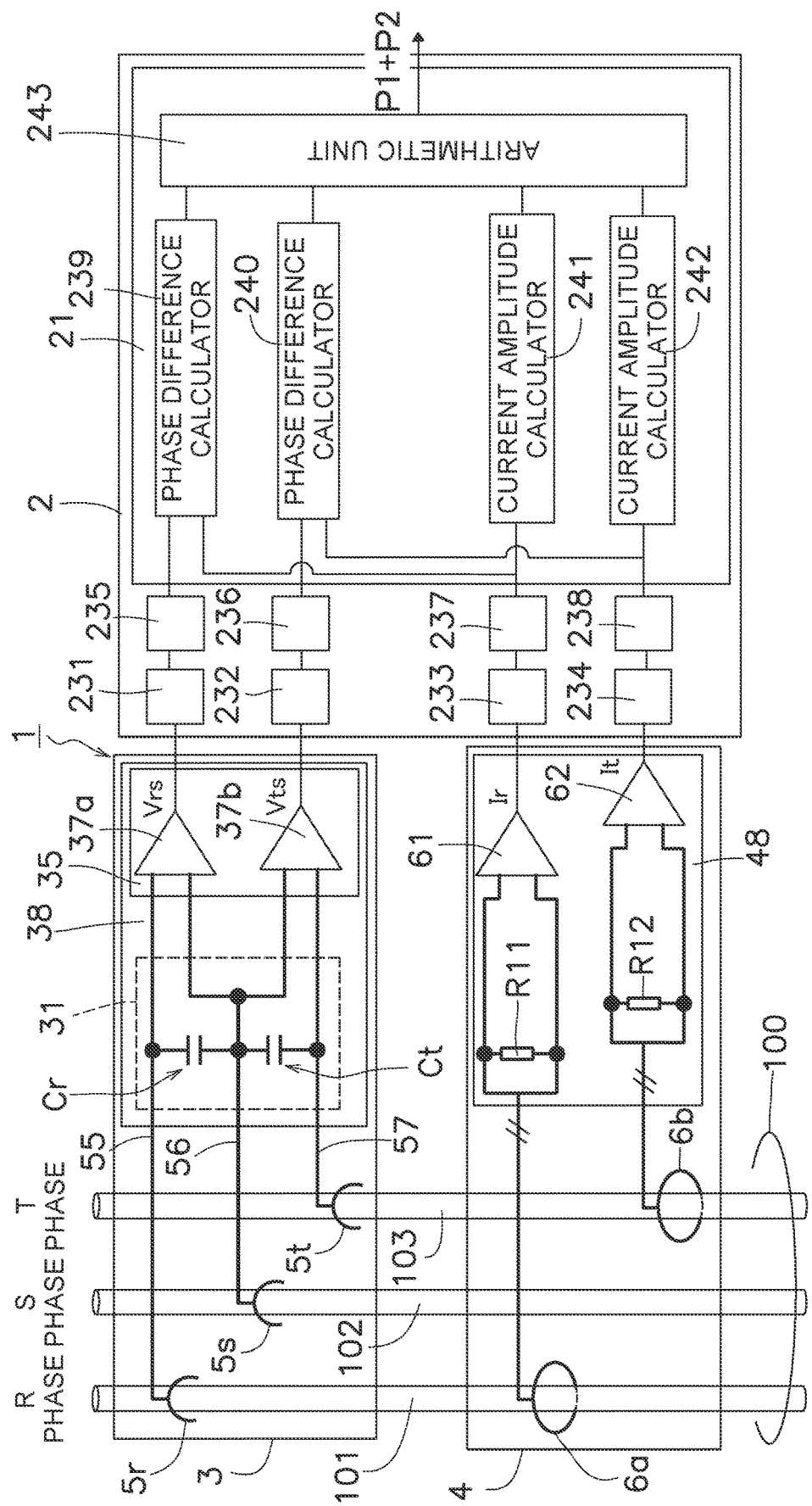
FIG. 9 is a circuit diagram illustrating an example of the configuration of a power measurement apparatus according to a second embodiment.

In the first embodiment, a description has been given of a case where the power calculator 2 calculates the active power P by using the product of an instantaneous voltage and an instantaneous current. However, the configuration of the power calculator 2 can be modified as in a second embodiment described below. As illustrated in FIG. 9, the power calculator 2 of the power measurement apparatus 1 includes filters 231 to 234, AD converters 235 to 238, phase difference calculators 239 and 240, current amplitude calculators 241 and 242, and an arithmetic unit 243. The power calculator 2 can be implemented by, for example, a computer including a filter and an AD converter. For example, the computer executes a program to form the power computation unit 21 in a CPU of the computer.

The voltage detector 3 and the current detector 4 according to the second embodiment are similar to those of the first embodiment. The voltage detector 3 detects in a contactless manner an AC voltage of the conductive path 100 to which power is supplied from an AC power source whose magnitude of the AC voltage is regulated to be a predetermined value. The voltage detector 3 outputs voltage waveforms of the AC voltages Vrs and Vts, which are first data signal regarding the voltage waveform of the voltage of the conductive path 100. The current detector 4 detects in a contactless manner an AC current flowing through the conductive path 100. The current detector 4 outputs analog signals indicating the AC currents Ir and It output from the current transformers 6a and 6b, which are second data signal regarding the current waveform.

The filters 231 and 232 filter the analog signals indicating the voltage waveforms of the AC voltages Vrs and Vts output from the amplifiers 37a and 37b of the voltage detector 3, respectively. For example, if the AC voltage of the AC power source 900 has a frequency of 60 Hz, the filters 231 and 232 attenuate voltage waveforms having frequencies other than 60 Hz. In other words, the filters 231 and 232 output analog signals indicating the voltage waveforms of the fundamentals of the AC voltages.

The filters 233 and 234 filter output signals of the amplifiers 61 and 62 of the current detector 4 indicating the output currents Ir and It of the current transformers 6a and 6b, respectively. The filters 233 and 234 attenuate current waveforms having frequencies other than a frequency of 60 Hz of the AC power source 900. In other words, the filters 233 and 234 output analog signals indicating the current waveforms of the fundamentals of the AC currents and the magnitude of the currents.

The AD converters 235, 236, 237, and 238 convert the analog signals output from the filters 231, 232, 233, and 234 into digital signals.

The current amplitude calculators 241 and 242 detect the amplitudes of the AC currents from the output signals of the AD converters 237 and 238, respectively. The current amplitude calculators 241 and 242 output signals indicating, for example, the magnitudes of the effective values $Ir_{rms}$ and $It_{rms}$ of the AC currents to the arithmetic unit 243, respectively, The phase difference calculator 239 detects a phase difference Φ1 between the fundamental of the AC voltage Vrs indicated by the output signal of the AD converter 235 and the fundamental of the AC current Ir indicated by the output signal of the AD converter 237. The phase difference calculator 240 detects a phase difference Φ2 between the fundamental of the AC voltage Vts indicated by the output signal of the AD converter 236 and the fundamental of the AC current It indicated by the output signal of the AD converter 238. Since the fundamentals of the AC voltages Vrs and Vts and the fundamentals of the AC currents Ir and It are simple sine waves, the detection of the phase differences Φ1 and Φ2 can be easily calculated using a conventionally known method, and thus a detailed description of the phase difference calculators 239 and 240 will be omitted here.

The arithmetic unit 243 calculates the active power P using the magnitudes $Ir_{rms}$ and $It_{rms}$ of the fundamentals of the AC currents Ir and It output from the filters 233 and 234, the specified value (here, an effective value of 200 V) of the magnitude of the voltage of the AC power source 900, and the phase differences Φ1 and Φ2 between the fundamentals of the AC voltages Vrs and Vts and the fundamentals of the AC currents Ir and It. Specifically, the arithmetic unit 243 computes the sum of P1 and P2 given by equation (3) and equation (4) below. Note that denotes a current conversion coefficient determined by the current transformers 6a and 6b.

$$P1 = 200 \times (\gamma \times Ir_{rms}) \times \cos\Phi1 \qquad (3)$$

$$P2 = 200 \times (\gamma \times It_{rms}) \times \cos\Phi2 \qquad (4)$$

(7) Overview of Power Measurement Method

Figure 10:
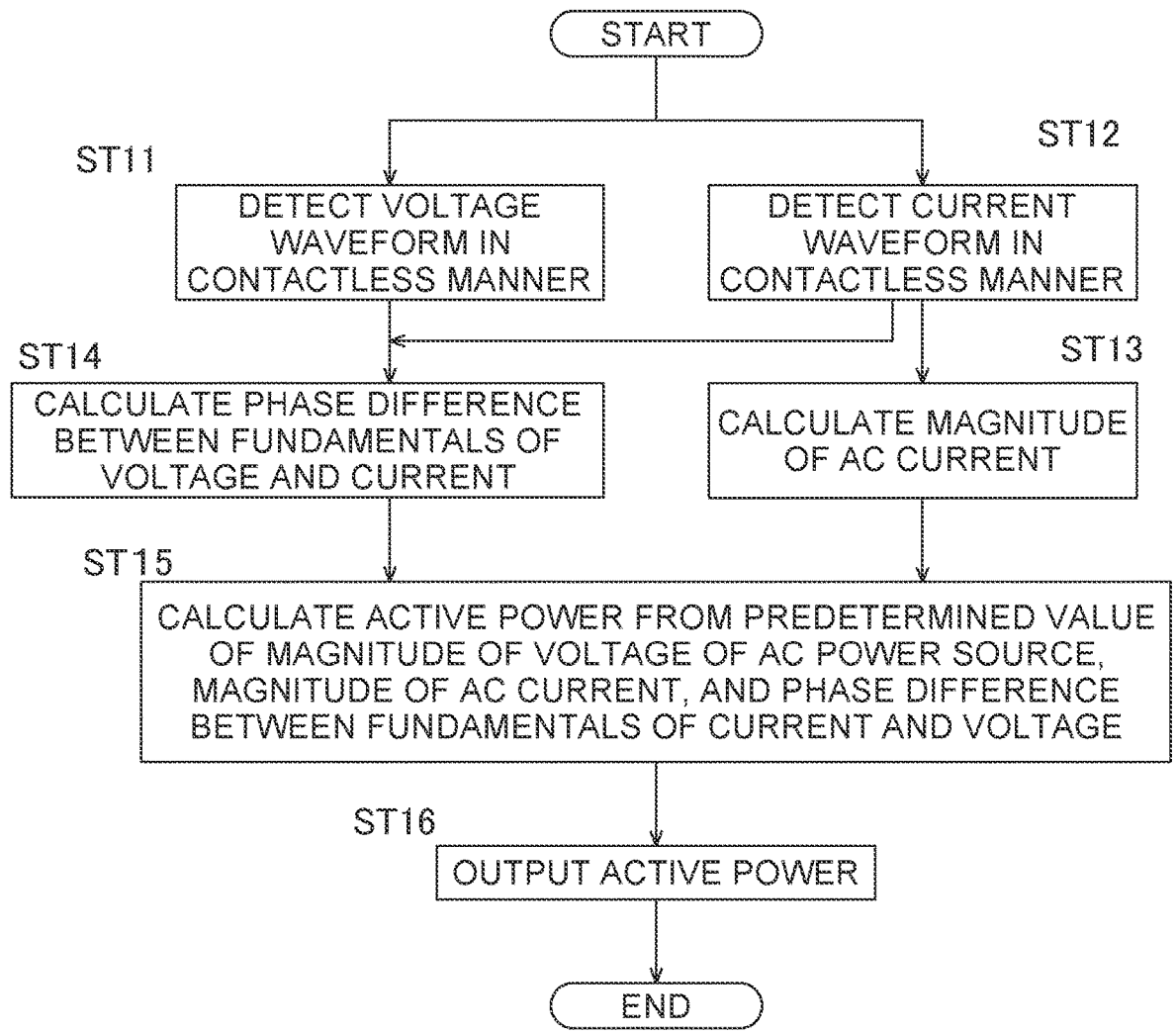
FIG. 10 is a flowchart illustrating how a power measurement method according to the second embodiment is performed.

An overview of a power measurement method will be described with reference to FIG. 10, First, the power measurement apparatus 1 detects in a contactless manner a voltage waveform of an AC voltage of the conductive path 100 to which power is supplied from the AC power source 900 whose magnitude of the AC voltage is regulated to be a predetermined value (step ST11). As described above, the voltage detector 3 detects the voltage waveform of the AC voltage in a contactless manner by using the probes 5r, 5s, and 5t attached to the first electric wire 101, the second electric wire 102, and the third electric wire 103.

At the same time as the detection of the voltage waveform (step ST11), the power measurement apparatus 1 detects in a contactless manner a current waveform of an AC current flowing through the conductive path 100 (step ST12). As described above, the current detector 4 detects the current waveform of the AC current in a contactless manner by using the current transformers 6a and 6b attached to the first electric wire 101 and the third electric wire 103. The power measurement apparatus 1 calculates the magnitude of the AC current from the current waveform (step ST13). As described above, in the second embodiment, for example, the current amplitude calculators 241 and 242 calculate the magnitudes of the effective value $Ir_{rms}$ and $It_{rms}$ of the AC currents, respectively. Further, the power measurement apparatus 1 calculates a phase difference between the fundamental of the current waveform and the fundamental of the voltage waveform (step ST14). In the power measurement apparatus 1, the power computation unit 21 calculates the active power of the conductive path 100 from the predetermined value defining the magnitude of the voltage of the AC power source 900, the magnitude of the AC current of the current waveform, and the phase difference between the fundamental of the current waveform and the fundamental of the voltage waveform (step ST15). The power measurement apparatus 1 outputs the active power of the conductive path 100 calculated by the power computation unit 21 (step ST16).

(8) Features 8-1

In the power measurement apparatus 1 or the power measurement method according to the second embodiment, with the use of a predetermined value regulated as the magnitude of the voltage of the AC power source 900, the influence of contactless detection of an AC voltage using the probes 5r, 5s, and 5t on power calculation can be suppressed. Thus, power measurement accuracy is improved.

(9) Modifications (9-1) Modification 2A

In the second embodiment, a description has been given of a case where the AC power source 900 is configured to supply a three-phase alternating current. However, the application of the technique described in the second embodiment is not limited to an AC power source configured to supply a three-phase alternating current. For example, the technique described in the second embodiment is also applicable to an AC power source configured to supply a two-phase alternating current.

(9-2) Modification 2B

A description has been given of a case where in the power measurement apparatus 1 according to the second embodiment, the filters 231 to 234 are used to detect the fundamentals of the current waveforms and the voltage waveforms. However, the method for detecting the fundamentals of the current waveforms and the voltage waveforms is not limited to the method using the filters 231 to 234. For example, the power measurement apparatus 1 may be configured to use FFT analysis to detect the fundamentals of the current waveforms and the voltage waveforms.

Third Embodiment

(10) Overall Configuration

Figure 11:
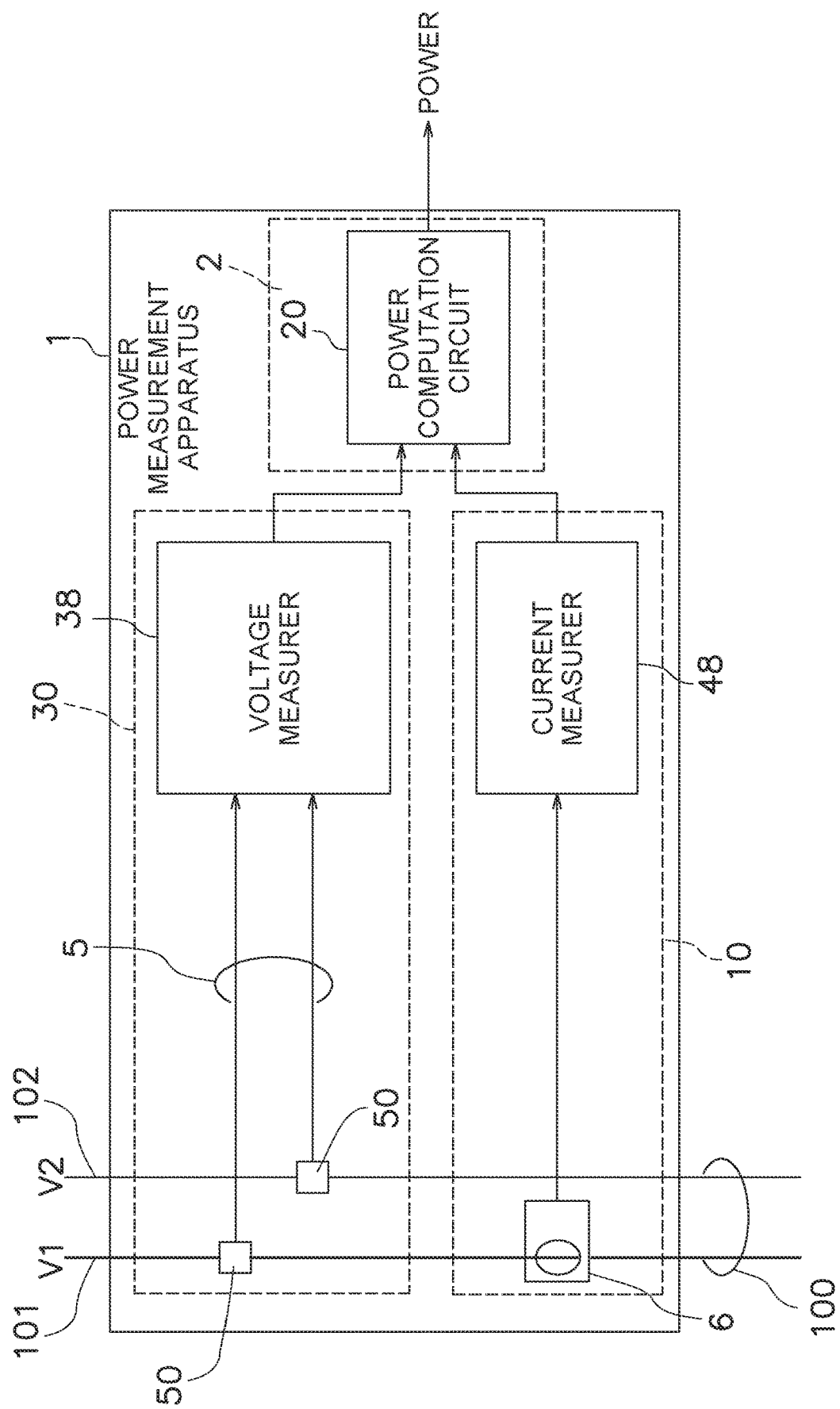
FIG. 11 is a block diagram illustrating an overview of the configuration of a power measurement apparatus.

As illustrated in FIG. 11, the power measurement apparatus 1 is an apparatus for measuring power supplied through the conductive path 100. In a third embodiment, a description will be given of a case where the conductive path 100 is constituted by a first electric wire 101 and a second electric wire 102. In the present disclosure, the term "electric wire" refers to a portion formed of only a conductor and does not include an insulating coating arranged around the conductor for insulation. An AC power supply voltage is applied to the conductive path 100. When power is consumed by a device connected to the conductive path 100, an AC current flows through the conductive path 100.

As illustrated in FIG. 11, the power measurement apparatus 1 includes a power computation circuit 20 corresponding to the power calculator 2 according to the first embodiment and the second embodiment, a contactless current measurement circuit 10 corresponding to the current detector 4 according to the first embodiment and the second embodiment, and a contactless voltage measurement circuit 30 corresponding to the voltage detector 3 according to the first embodiment and the second embodiment.

(10-1) Contactless Current Measurement Circuit 10

As illustrated in FIG. 11, the contactless current measurement circuit 10 includes a current transformer 6 and a current measurer 48. The current transformer 6 is arranged so as not to come into contact with the first electric wire 101. The current transformer 6 transforms an AC current flowing in the first electric wire 101 and outputs an AC current having a different current magnitude from that of the AC current flowing in the first electric wire 101. The current measurer 48 is connected to the current transformer 6. The current measurer 48 receives the AC current, which has been transformed by the current transformer 6, and outputs an analog signal 11 corresponding to the AC current flowing in the first electric wire 101.

(10-2) Contactless Voltage Measurement Circuit 30

Figure 13:
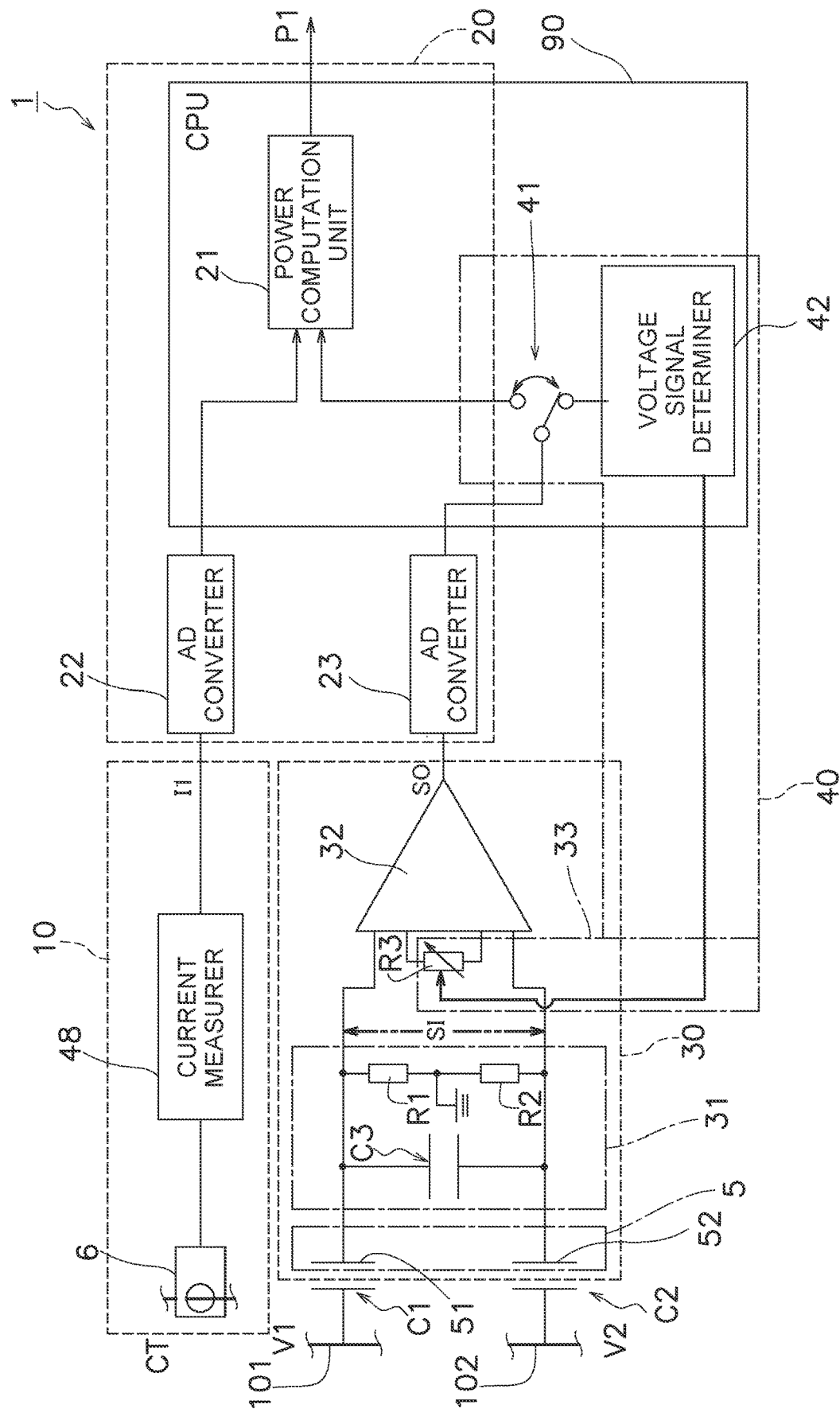
FIG. 13 is a circuit diagram illustrating the configuration of a power measurement apparatus according to a third embodiment.

The contactless voltage measurement circuit 30 includes a probe 5 and a voltage measurer 38. The probe 5 is arranged so as not to come into contact with the conductive path 100. The probe 5 is capacitively coupled to the conductive path 100. The voltage measurer 38 includes an input part. 31, a differential amplifier 32, and a regulator 33, as illustrated in FIG. 13.

(10-2-1) Probe 5

Figure 12:
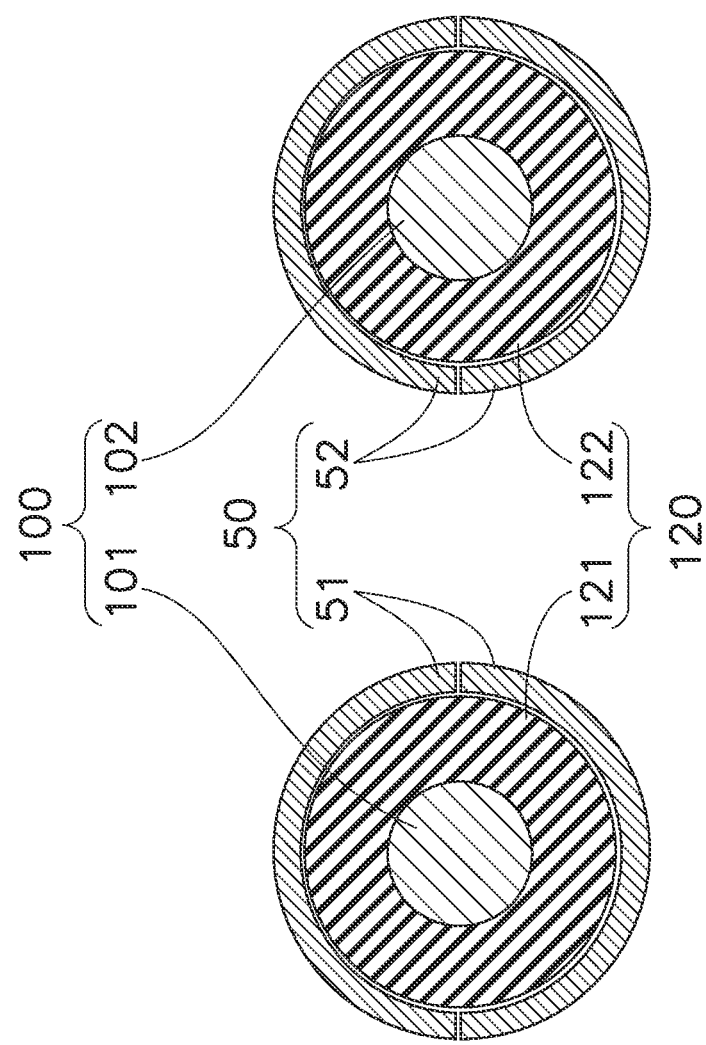
FIG. 12 is a schematic cross-sectional view for describing a relationship between the probes and electric wires.

FIG. 12 schematically illustrates a relationship between the conductive path 100 and the probe 5. The probe 5 has an electrode 50. The electrode 50 is arranged so as not to come into contact with the conductive path 100. The electrode 50 includes a first electrode 51 arranged so as not to come into contact with the first electric wire 101, and a second electrode 52 arranged so as not to come into contact with the second electric wire 102.

An insulating coating 120 is disposed around the conductive path 100 for insulation. A first insulating coating 121 made of, for example, plastic or rubber is provided around the first electric wire 101. A second insulating coating 122 made of, for example, plastic or rubber is provided around the second electric wire 102. Accordingly, the case where the electrode 50 of the probe 5 is arranged so as not to come into contact with the conductive path 100 includes a case where the electrode 50 comes into contact with the insulating coating 120 around the conductive path 100 composed of a conductor. More specifically, the case where the first electrode 51 is arranged so as not to come into contact with the first electric wire 101 includes a case where the first electrode 51 comes into contact with the first insulating coating 121. The case where the second electrode 52 is arranged so as not to come into contact with the second electric wire 102 includes a case where the second electrode 52 comes into contact with the second insulating coating 122.

Figure 14:
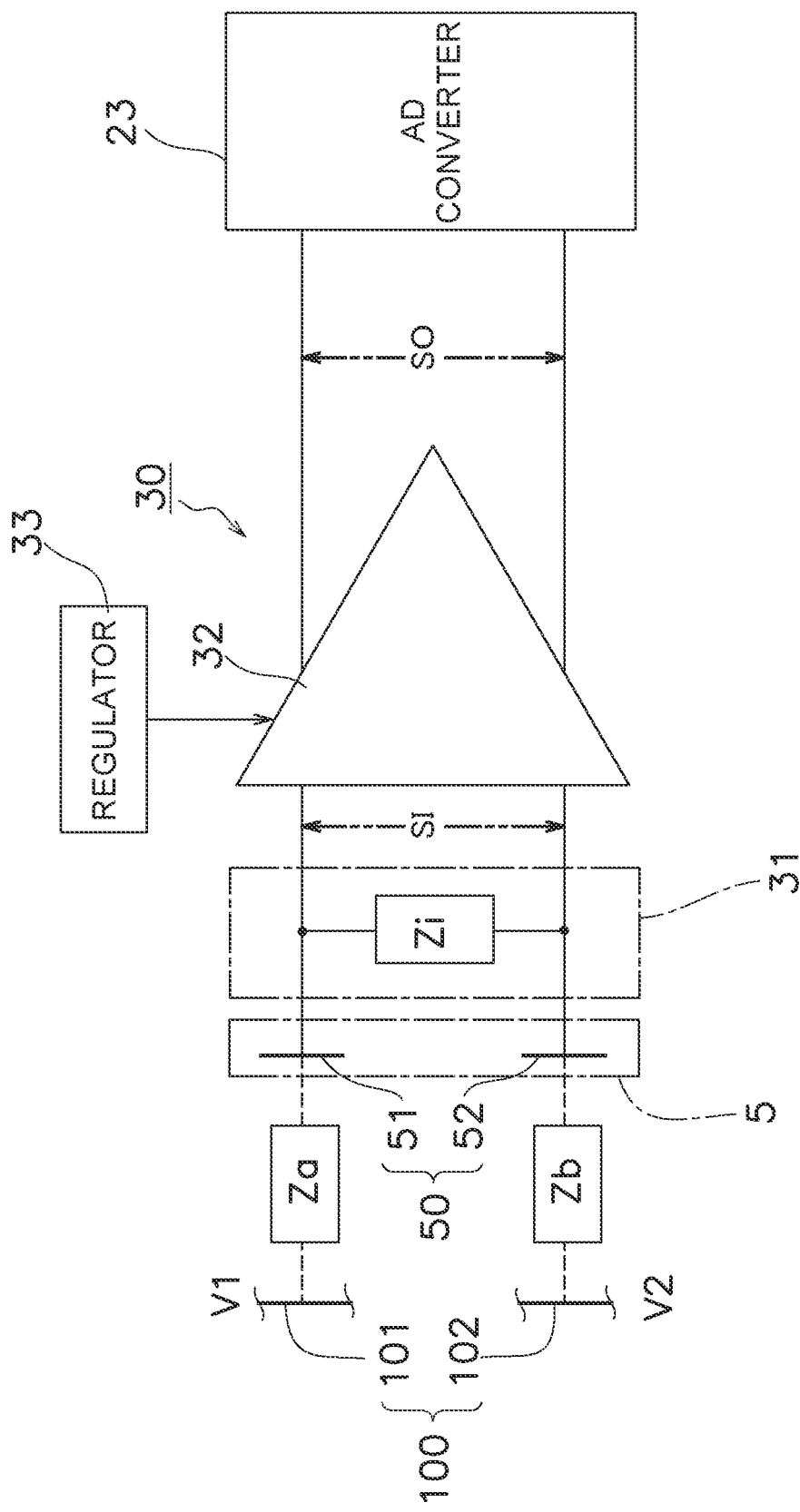
FIG. 14 is a conceptual diagram for describing an overview of the configuration of a contactless voltage measurement circuit in FIG. 11.

FIG. 13 illustrates the configuration of the power measurement apparatus 1 in more detail, A capacitor C1 illustrated in FIG. 13 is a capacitor formed by the first electric wire 101, the first electrode 51, and the first insulating coating 121. The insulating coating 121 serves as a dielectric. In other words, the first electric wire 101 and the first electrode 51 are capacitively coupled to each other. While only the capacitor C1 is illustrated, actually, not only a capacitive component but also, for example, a resistance component is generated between the first electric wire 101 and the first electrode 51. In another point of view, as illustrated in FIG. 14, the probe 5 generates an impedance Za including a capacitive component between the first electric wire 101 and the first electrode 51.

A capacitor C2 illustrated in FIG. 13 is a capacitor formed by the second electric wire 102, the second electrode 52, and the second insulating coating 122. The insulating coating 122 serves as a dielectric, in other words, the second electric wire 102 and the second electrode 52 are capacitively coupled to each other. While only the capacitor C2 is illustrated, actually, not only a capacitive component but also, for example, a resistance component is generated between the second electric wire 102 and the second electrode 52. In another point of view, as illustrated in FIG. 14, the probe 5 generates an impedance Zb including a capacitive component between the second electric wire 102 and the second electrode 52.

(10-2-2) Input Part 31

The input part 31 is connected to the probe 5. The input part 31 produces an input signal SI corresponding to the waveform of the AC power supply voltage on the basis of the potential of the electrode 50. In the contactless voltage measurement circuit 30 illustrated in FIG. 13, the potential difference between the first electrode 51 and the second electrode 52 is the input signal SI.

(10-2-3) Differential Amplifier 32

The input signal SI produced by the input part 31 is input to the differential amplifier 32, The differential amplifier 32 amplifies the input signal SI and outputs an output signal SO. The differential amplifier 32 outputs the output signal SO to the power computation circuit 20.

(10-2-4) Regulator 33

The regulator 33 regulates at least one of the gain of the differential amplifier 32 and the magnitude of the input signal SI produced by the input part 31 on the basis of the magnitude of the output signal SO of the differential amplifier 32 to keep the magnitude of the output signal SO of the differential amplifier 32 within a predetermined range. The differential amplifier 32 according to the third embodiment is a differential amplifier whose gain can be changed by the regulator 33. The regulator 33 according to the third embodiment has a function of regulating the gain of the differential amplifier 32. The regulation of the magnitude of the input signal SI produced by the input part 31 will be described in another embodiment.

The predetermined mange is set in advance to a range that is smaller than the full scale output of the differential amplifier 32 and that allows an appropriate resolution to be maintained. The predetermined range is a range in which the magnitude of the output signal SO of the differential amplifier 32 is a specific proportion of the full scale output of the differential amplifier 32. The predetermined range is, for example, a range in which the effective value of the output signal SO of the differential amplifier 32 is a specific proportion of the full scale output of the effective value of the differential amplifier 32. The specific proportion is determined such that, for example, the effective value of the output signal SO is in the range of 60%±5% or the range of 60% to 50% of the fill scale output of the differential amplifier 32. Alternatively, the predetermined range is, for example, a range in which the absolute value of the peak value of the output signal SO is a specific proportion of the full scale output of the absolute value of the peak value of the differential amplifier 32.

The regulator 33 is preferably configured such that the magnitude of the output signal SO of the differential amplifier 32 obtained when the gain of the differential amplifier 32 is regulated to the minimum is allowed to be smaller than one half of the magnitude of the output signal SO of the differential amplifier 32 obtained when the gain is regulated to the maximum. This is because an example in which the magnitude of the input signal SI changes about twice in one day due to a change in environment (such as humidity or temperature) even when the magnitude of the AC power supply voltage is constant has been observed in an experiment.

(10-3) Power Measurement by Power Measurement Apparatus 1

The power measurement apparatus 1 feeds back a signal indicating the magnitude of the output signal SO of the differential amplifier 32 of the contactless voltage measurement circuit 30 to the regulator 33 to regulate the magnitude of the voltage waveform to be measured by the contactless voltage measurement circuit 30. The power measurement apparatus 1 determines that the effective value of the AC power supply voltage applied to the conductive path 100 is the predetermined value, and measures the power supplied through the conductive path 100 on the basis of the measurement results of the contactless voltage measurement circuit 30 and the contactless current measurement circuit 10. For example, in the case of a commercial AC power supply voltage of 100 V, the predetermined value of the effective value is 100 V.

(11) Detailed Configuration

(11-1) Power Computation Circuit 20

The power computation circuit 20 includes a power computation unit 21 and AD converters 22 and 23. The power computation unit 21 is implemented by a CPU (central processing unit) 90. The CPU 90 executes a program stored in a memory (not illustrated) to form the power computation unit 21. The power computation circuit 20 calculates a power value using a current value output from the AD converter 22 and a voltage value output from the AD converter 23.

The AD converter 22 is connected to the current measurer 48. The AD converter 22 converts an instantaneous value of the analog signal 11 into a digital signal. The number of digits of the digital signal output from the AD converter 22 is the number of digits that can be input to the CPU 90 in the subsequent stage. For example, if the CPU 90 can input a 16-bit digital signal, 1 bit is used to indicate positive or negative, and the remaining 15 bits (15 digits) are used to represent the magnitude of the instantaneous value.

The AD converter 23 receives the output signal SO of the differential amplifier 32. The AD converter 23 converts an instantaneous value of the output signal SO, which is an analog signal, into a digital signal and outputs the digital signal to the CPU 90. The number of digits of the digital signal output from the AD converter 23 is the number of digits that can be input to the CPU 90 in the subsequent stage. For example, if the CPU 90 can input a 16-bit digital signal, 1 bit is used to indicate positive or negative, and the remaining 15 bits (15 digits) are used to represent the magnitude of the instantaneous value.

(11-2) Input Part 31

As illustrated in FIG. 13, the input part 31 according to the third embodiment includes a capacitor C3 and resistors R1 and R2. One end of the capacitor C3 is connected to the first electrode 51 of the probe 5, and the other end of the capacitor C3 is connected to the second electrode 52 of the probe 5. One end of the resistor R1 is connected to the first electrode 51, and the other end is grounded. One end of the resistor R2 is connected to the second electrode 52, and the other end is grounded. Further, the one end of the resistor R1 is connected to one input terminal of the differential amplifier 32, and the one end of the resistor R2 is connected to the other input terminal of the differential amplifier 32. The potential difference between the potential at the one end of the resistor R1 and the potential at the one end of the resistor R2 is amplified by the differential amplifier 32. The potential difference between the potential at the one end of the resistor 1 and the potential at the one end of the resistor R2 is the input signal SI.

As illustrated in FIG. 14, the input part 31 can be regarded as generating an impedance Zi between the first electrode 51 and the second electrode 52 of the probe 5. As can be seen from FIG. 14, the duce impedances Za, Zi, and Zb are connected in series between the first electric wire 101 and the second electric wire 102. Accordingly, the voltage (potential difference) produced across the impedance Zi is a voltage obtained by dividing the AC power supply voltage applied between the first electric wire 101 and the second electric wire 102.

Since Za≈the capacitance value of the capacitor C1, Zb≈the capacitance value of the capacitor C2, and Zi≈the capacitance value of the capacitor C3, the voltage is substantially a voltage that is divided by the capacitors C1, C21, and C3 connected in series. In other words, the input part 31 according to the third embodiment includes a voltage divider circuit.

(11-3) Regulator 33

The regulator 33 includes a programmable resistor R3. The programmable resistor R3 functions as again resistor that changes the gain of the differential amplifier 32. FIG. 13 illustrates a case where the programmable resistor R3 is externally attached to the differential amplifier 32. However, the programmable resistor R3 functioning as a gain resistor may be incorporated in the differential amplifier 32. The programmable resistor R3 has a resistance value that changes in accordance with a fed back signal indicating the magnitude of the output signal SO.

(11-4) Feedback Circuit 40

The power measurement apparatus 1 includes a feedback circuit 40 that feeds back a signal indicating the magnitude of the output signal SO of the differential amplifier 32 to the regulator 33. The feedback circuit 40 according to the third embodiment includes a switch 41 and a voltage signal determiner 42.

The switch 41 selectively switches to which of the power computation unit 21 and the voltage signal determiner 42 to provide the digital signal provided from the AD converter 23. The switch 41 is implemented by the CPU 90. The CPU 90 executes a program stored in the memory (not illustrated) to form the switch 41. While a case where the switch 41 is implemented by the CPU 90 is described here as an example, the switch 41 may be disposed as one physical component.

The voltage signal determiner 42 is implemented by the CPU 90. The CPU 90 executes a program stored in the memory (not illustrated) to form the voltage signal determiner 42. While a case where the voltage signal determiner 42 is implemented by the CPU 90 is described here as an example, the voltage signal determiner 42 may be disposed as one physical component.

The voltage signal determiner 42 determines the magnitude of the output signal SO of the differential amplifier 32 before the power computation unit 21 performs power computation. Accordingly, the switch 41 is switched before power computation to provide the digital signal provided from the AD converter 23 to the voltage signal determiner 42. The voltage signal determiner 42 outputs a signal indicating the magnitude of the output signal SO to the regulator 33 so that the magnitude of the output signal SO can be kept within a predetermined range. When the magnitude of the output signal SO is kept within the predetermined range, the voltage signal determiner 42 switches the switch 41 so that the digital signal provided from the AD converter 23 can be provided to the power computation unit 21.

If the output signal SO is large, the voltage signal determiner 42 outputs a feedback signal for decreasing the gain of the differential amplifier 32 to the programmable resistor R3. In other words, the feedback signal for decreasing the gain of the differential amplifier 32 is a signal indicating that the output signal SO is large. If the output signal SO is small, the voltage signal determiner 42 outputs a feedback signal for increasing the gain of the differential amplifier 32 to the programmable resistor R3. In other words, the feedback signal for increasing the gain of the differential amplifier 32 is a signal indicating that the output signal SO is small.

(12) Overall Operation

For example, when a device such as an air conditioner is connected to the conductive path 100 and is in operation, power is consumed by the device connected to the conductive path 100. At this time, a current flows through the conductive path 100 in accordance with the power supplied to the device. Since the AC power supply voltage is applied to the conductive path 100, computation of the power requires not only the values of the voltage and current supplied through the conductive path 100 but also a voltage waveform and a current waveform to compute the power factor.

Since the process related to the current by using the contactless current measurement circuit 10 and the power computation circuit 20 is performed by a known method that is conventionally known, a description of the process related to the current will be omitted here.

A case where the conductive path 100 is connected to a commercial AC power source of 100 V will be described as an example. In this case, for example, the power computation circuit 20 stores information indicating that the commercial AC power source is 100 V in the memory (not illustrated). The power computation unit 21 determines that the effective value of the AC voltage related to the AC power to be computed is 100 V (an example of the predetermined value) from the storage of the memory.

The power computation unit 21 computes the effective value of the AC current from the digital signal related to the AC current provided from the AD converter 22.

The power computation unit 21 computes the power factor from the digital signals related to the AC current and the AC voltage provided from the AD converter 22 and the AD converter 23 by using the AC current waveform and the AC voltage waveform. In this computation, the power computation unit 21 can use an AC voltage waveform obtained from the output signal SO of the differential amplifier 32 whose magnitude is regulated to fall within the predetermined range by the regulator 33.

The power computation unit 21 computes power consumption using the effective value of the AC current and the power factor, which are computed in the way described above, and the stored effective value of the AC voltage. While a description has been given of a case where the power computation unit 21 computes power consumption using the effective value of the AC current, the effective value of the AC voltage, and the power factor, the method for computing power consumption is not limited to such a method. For example, the power computation unit 21 may be configured to compute power consumption from the average of the product of an instantaneous value of the AC current and an instantaneous value of the AC voltage. For example, the configuration of the power computation circuit 20 according to the third embodiment may be the same as the configuration of the power calculator 2 according to the first embodiment. For example, the configuration of the power computation circuit 20 according to the third embodiment may be the same as the configuration of the power calculator 2 according to the second embodiment.

(13) Modifications (13-1) Modification 3A

In the third embodiment, a description has been given of a case where the power measurement apparatus 1 has a configuration in which a period during which the feedback circuit 40 generates a signal to be fed back and a period during which the power computation unit 21 computes power are separate. However, as illustrated in FIG. 15, the power measurement apparatus 1 may be configured such that the power computation unit 21 computes power while the feedback circuit 40 generates a signal to be fed back.

Figure 15:
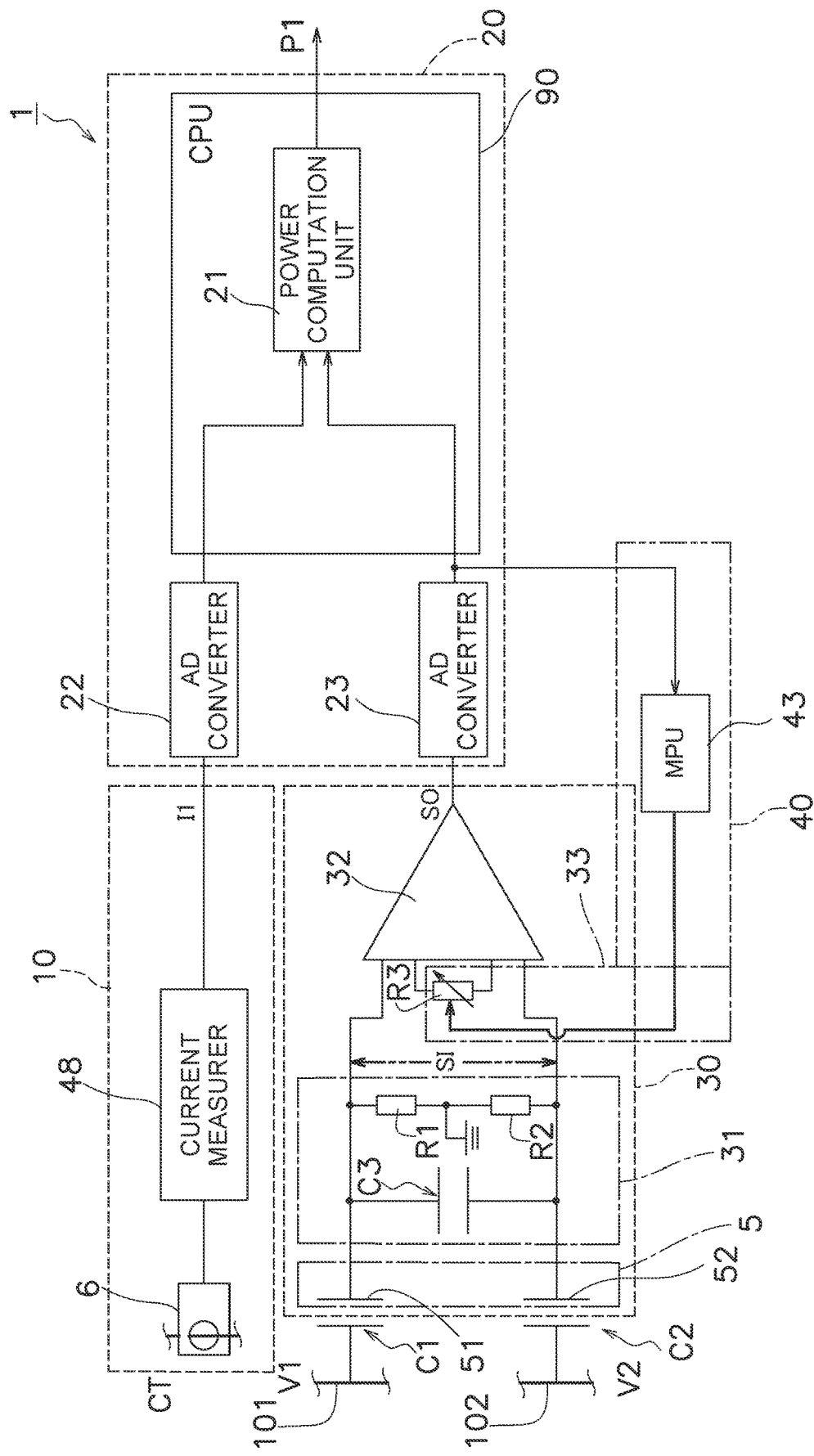
FIG. 15 is a circuit diagram illustrating the configuration of a power measurement apparatus according to Modification 3A.

The feedback circuit 40 illustrated in FIG. 15 includes, for example, a microprocessing unit (MPU) 43. The MPU 43 receives a digital signal indicating an AC voltage output from the AD converter 23. The MPU 43 calculates the magnitude of the output signal SO of the differential amplifier 32 from the digital signal of the AD converter 23, and determines a gain resistance that can keep the output signal SO within a predetermined range. The MPU 43 outputs a control signal for changing the gain resistance to a determined value to the programmable resistor R3.

(13-2) Modification 3B

In the third embodiment, a description has been given of a case where the regulator 33 that regulates the gain of the differential amplifier 32 is the programmable resistor R3. However, the method for regulating the gain of the differential amplifier 32 is not limited to changing a resistance value determining the gain. For example, a programmable gain amplifier having an integration of the functions of a regulator and a differential amplifier may be used. Further, the differential amplifier having an integration of the functions of a regulator and a differential amplifier may be, for example, a differential amplifier whose gain is changed in accordance with the magnitude of a voltage provided from the outside.

Fourth Embodiment

(14) Overall Configuration

A power measurement apparatus 1 according to a fourth embodiment is different from the power measurement apparatus 1 according to the third embodiment in the configuration of the contactless voltage measurement circuit 30 and the regulator 33. Thus, the power measurement apparatus 1 and the contactless voltage measurement circuit 30 according to the fourth embodiment will be described focusing on the modified points of the contactless voltage measurement circuit 30 and the regulator 33, whereas the description of the other portions will be omitted.

Figure 16:
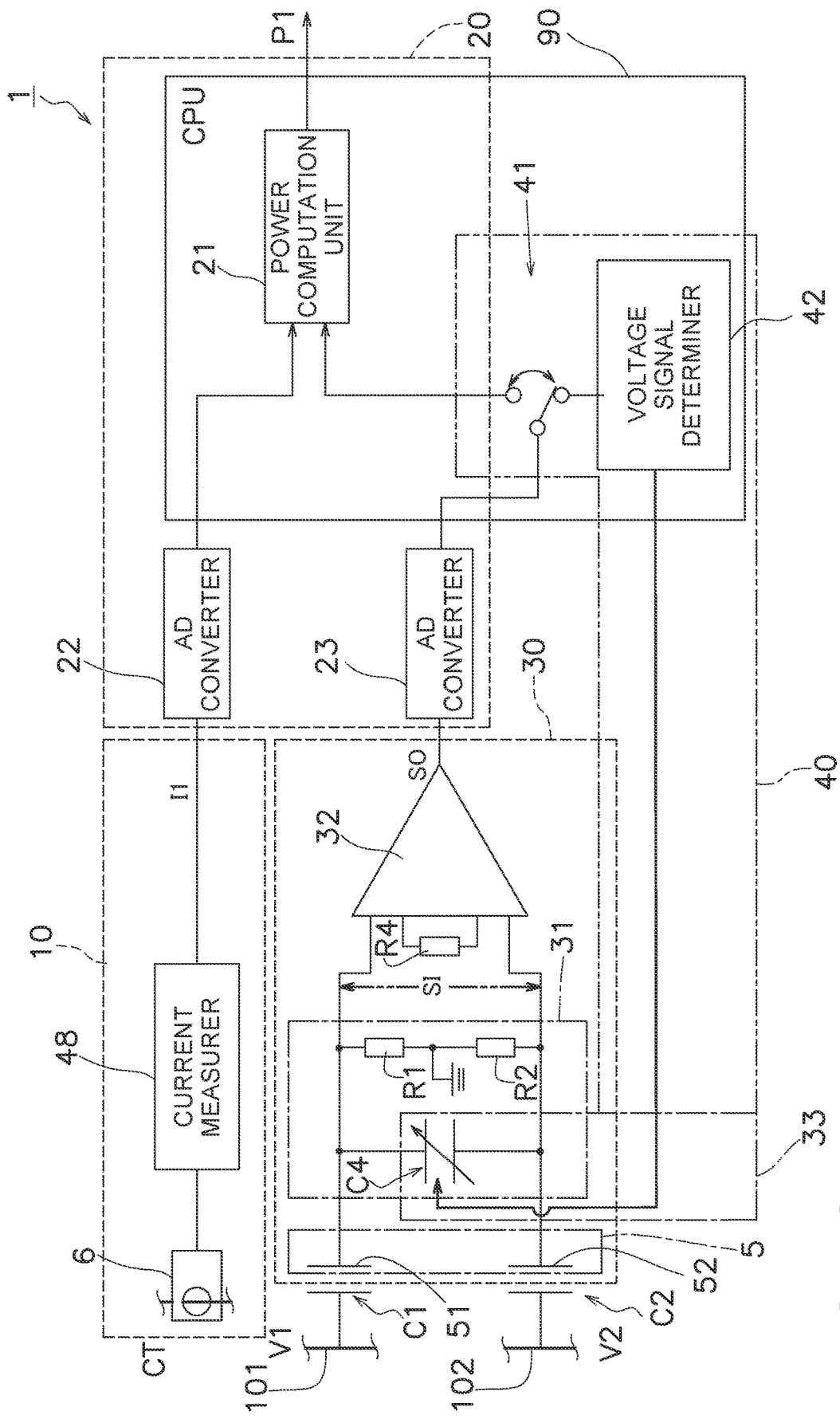
FIG. 16 is a circuit diagram illustrating the configuration of a power measurement apparatus according to a fourth embodiment.

The regulator 33 according to the fourth embodiment illustrated in FIG. 16 regulates the magnitude of the input signal SI produced by the input part 31 on the basis of the magnitude of the output signal SO of the differential amplifier 32 to keep the magnitude of the output signal SO of the differential amplifier 32 within a predetermined range.

(15) Detailed Configuration (15-1) Input Part 31

As illustrated in FIG. 16, the input part 31 according to the fourth embodiment includes a programmable capacitor C4 and resistors R1 and R2. One end of the programmable capacitor C4 is connected to the first electrode 51 of the probe 5, and the other end of the programmable capacitor C4 is connected to the second electrode 52 of the probe 5. One end of the resistor R1 is connected to the first electrode 51, and the other end is grounded. One end of the resistor R2 is connected to the second electrode 52, and the other end is grounded. Further, the one end of the resistor R1 is connected to one input terminal of the differential amplifier 32, and the one end of the resistor R2 is connected to the other input terminal of the differential amplifier 32. The potential difference between the potential at the one end of the resistor R1 and the potential at the one end of the resistor R2 is amplified by the differential amplifier 32. The potential difference between the potential at the one end of the resistor R1 and the potential at the one end of the resistor R2 is the input signal SI.

As illustrated in FIG. 14, the input part 31 can be regarded as generating an impedance $Z_i$ between the first electrode 51 and the second electrode 52 of the probe 5. As can be seen from FIG. 14, the three impedances $Z_a$, $Z_i$, and $Z_b$ are connected in series between the first electric wire 101 and the second electric wire 102. Accordingly, the voltage (potential difference) produced across the impedance $Z_i$ is a voltage obtained by dividing the AC power supply voltage applied between the first electric wire 101 and the second electric wire 102.

Since $Z_a \approx$ the capacitance value of the capacitor C1, $Z_b \approx$ the capacitance value of the capacitor C2, and $Z_i \approx$ the capacitance value of the programmable capacitor C4, the voltage is substantially a voltage that is divided by these three capacitors connected in series. In other words, the input part 31 according to the fourth embodiment includes a voltage divider circuit.

(15-2) Differential Amplifier 32

A resistor R4 that determines the gain of the differential amplifier 32 according to the fourth embodiment is a fixed resistor whose resistance value is not changeable.

(15-3) Regulator 33

As illustrated in FIG. 16, the regulator 33 according to the fourth embodiment includes the programmable capacitor C4. The programmable capacitor C4 is a variable capacitor. The programmable capacitor C4 functions as a variable capacitor that regulates the magnitude of the input signal SI produced by the input part 31. The programmable capacitor C4 has a capacitance value that changes in accordance with a fed back signal indicating the magnitude of the output signal SO.

The programmable capacitor C4 is preferably configured such that the magnitude of the output signal SO of the differential amplifier 32 obtained when the capacitance is regulated to the minimum is allowed to be smaller than one half of the magnitude of the output signal SO of the differential amplifier obtained when the capacitance is regulated to the maximum.

(15-4) Feedback Circuit 40

The voltage signal determiner 42 outputs a signal indicating the magnitude of the output signal SO to the regulator 33 so that the magnitude of the output signal SO can be kept within a predetermined range. If the output signal SO is large, the voltage signal determiner 42 outputs a feedback signal for decreasing the input signal SI of the differential amplifier 32 to the programmable capacitor C4. In other words, the feedback signal for decreasing the input signal SI is a signal indicating that the output signal SO is large. If the output signal SO is small, the voltage signal determiner 42 outputs a feedback signal for increasing the input signal SI to the programmable capacitor C4. In other words, the feedback signal for increasing the input signal SI is a signal indicating that the output signal SO is small.

(16) Modifications (16-1) Modification 4A

Also in the power measurement apparatus 1 according to the fourth embodiment, as in the power measurement apparatus 1 according to Modification 3A, the feedback circuit 40 can be modified such that the MPU 43 illustrated in FIG. 15 is used.

(16-2) Modification 4B

In the power measurement apparatus 1 and the contactless voltage measurement circuit 30 according to the fourth embodiment, the regulator 33 is configured using the programmable capacitor C4. However, the regulator 33 for controlling the magnitude of the input signal SI produced by the input part 31 is not limited to that having a configuration using a variable capacitor (the programmable capacitor C4).

Figure 17:
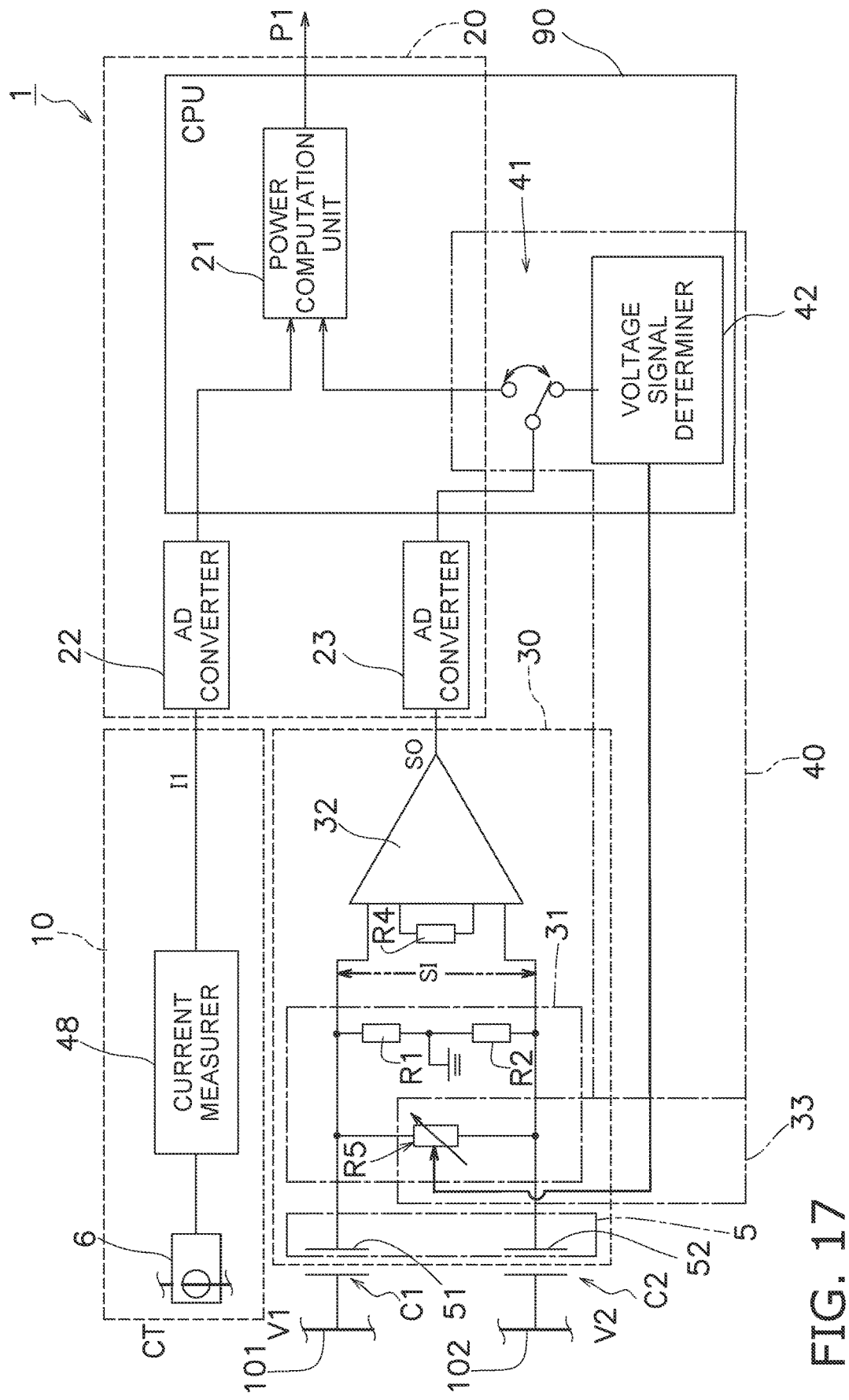
FIG. 17 is a circuit diagram illustrating the configuration of a power measurement apparatus according to Modification 4B.

For example, as illustrated in FIG. 17, a variable resistor R5 may be used in place of the variable capacitor C4 in FIG. 16. One end of the variable resistor R5 is connected to the first electrode 51 of the probe 5, and the other end of the variable resistor R5 is connected to the second electrode 52 of the probe 5, The variable resistor R5 is, for example, a programmable resistor. The regulator 33 can regulate the magnitude of the input signal SI produced by the input part 31 by changing the resistance value of the variable resistor R5.

Fifth Embodiment

(17) Overall Configuration

A power measurement apparatus 1 according to a fifth embodiment is different from the power measurement apparatus 1 according to the third embodiment in the configuration of the contactless voltage measurement circuit 30 and the regulator 33. Thus, the power measurement apparatus 1 and the contactless voltage measurement circuit 30 according to the fifth embodiment will be described focusing on the modified points of the contactless voltage measurement circuit 30 and the regulator 33, whereas the description of the other portions will be omitted.

Figure 18:
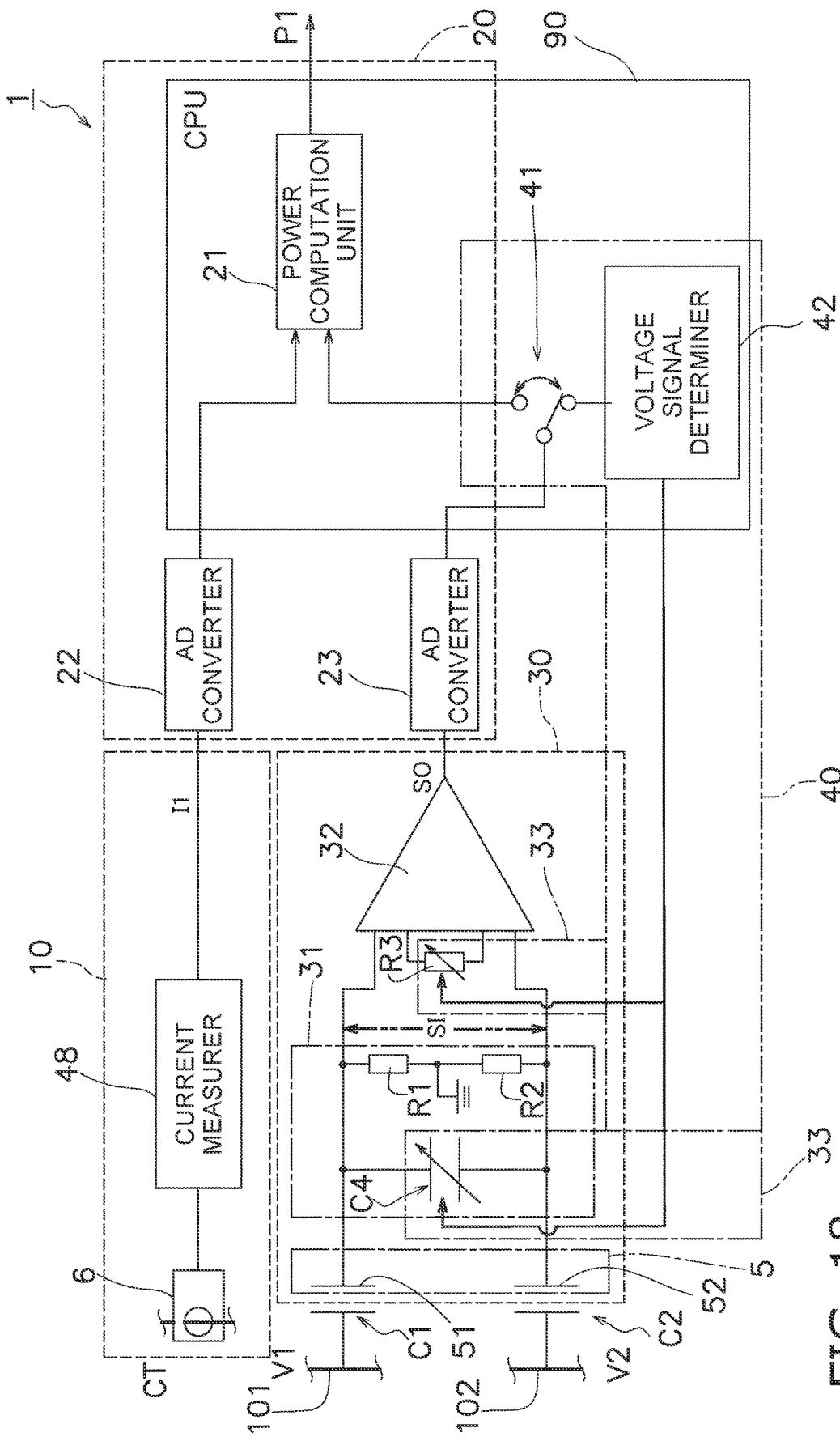
FIG. 18 is a circuit diagram illustrating the configuration of a power measurement apparatus according to a fifth embodiment.

The regulator 33 according to the fifth embodiment illustrated in FIG. 18 regulates the gain of the differential amplifier 32 and the magnitude of the input signal SI produced by the input part 31 on the basis of the magnitude of the output signal SO of the differential amplifier 32 to keep the magnitude of the output signal SO of the differential amplifier 32 within a predetermined range.

(18) Detailed Configuration (18-1) Input Part 31

As illustrated in FIG. 18, like the input part 31 according to the fourth embodiment, the input part 31 according to the fifth embodiment includes a programmable capacitor C4 and resistors R1 and R2.

(18-2) Differential Amplifier 32

As in the third embodiment, the differential amplifier 32 according to the fifth embodiment is configured such that the gain can be changed by the programmable resistor R3, The input signal SI produced by the input part 31 is input to the differential amplifier 32. The differential amplifier 32 amplifies the input signal SI and outputs an output signal SO. The differential amplifier 32 outputs the output signal SO to the power computation circuit 20.

(18-3) Regulator 33

As illustrated in FIG. 18, the regulator 33 according to the fifth embodiment is constituted by the programmable resistor R3 and the programmable capacitor C4.

The programmable resistor R3 and the programmable capacitor C4 are preferably configured such that the magnitude of the output signal SO of the differential amplifier 32 obtained when the resistance value and the capacitance are regulated to the minimum is allowed to be smaller than one half of the magnitude of the output signal SO of the differential amplifier obtained when the resistance value and the capacitance are regulated to the maximum.

(18-4) Feedback Circuit 40

The voltage signal determiner 42 outputs a signal indicating the magnitude of the output signal SO to the regulator 33 so that the magnitude of the output signal SO can be kept within a predetermined range. If the output signal SO is large, the voltage signal determiner 42 outputs a feedback signal to the programmable resistor R3 and the programmable capacitor C4 to decrease the input signal SI of the differential amplifier 32. If the output signal SO is small, the voltage signal determiner 42 outputs a feedback signal to the programmable resistor R3 and the programmable capacitor C4 to increase the input signal SI.

(19) Modifications (19-1) Modification 5A

Also in the power measurement apparatus 1 according to the fifth embodiment, as in the power measurement apparatus 1 according to Modification 3A, the feedback circuit 40 can be modified such that the MPU 43 illustrated in FIG. 15 is used.

(19-2) Modification 5B

In the power measurement apparatus 1 and the contactless voltage measurement circuit 30 according to the fifth embodiment, the regulator 33 is configured using the programmable resistor R3 and the programmable capacitor C4. However, the regulator 33 for controlling the magnitude of the input signal SI produced by the input part 31 is not limited to that having a configuration using the programmable resistor R3 and the programmable capacitor C4.

For example, as in the power measurement apparatus 1 according to Modification 4B, as illustrated in FIG. 17, the regulator 33 may be configured by using the variable resistor R5 as a resistor of the input part 31 according to the fifth embodiment.

(20) Features 20-1

In the contactless voltage measurement circuit 30 according to the embodiments and the modifications described above, the impedance generated between the electrode 50 of the probe 5 and the conductive path 100 may greatly change with a change in surrounding environment. More specifically, the impedance Za (an example of a first impedance) between the first electrode 51 and the first electric wire 101 and the impedance Zb (an example of a second impedance) between the second electrode 52 and the second electric wire 102, illustrated in FIG. 14, may greatly change with a change in surrounding environment.

If the impedance generated between the electrode 50 and the conductive path 100 greatly changes, the input signal SI to be input to the differential amplifier 32 greatly changes. However, the regulator 33 can regulate the gain of the differential amplifier 32 to keep the magnitude of the output signal SO of the differential amplifier 32 within a predetermined range, for example, within the range of 80%+5%. As a result, the resolution of the voltage waveform obtained by the power computation unit 21 from the differential amplifier 32 can be maintained within an appropriate range. As described above, even if the impedance between the electrode 50 of the probe 5 and the conductive path 100 changes depending on the surrounding environment, the contactless voltage measurement circuit 30 can suppress a decrease in the resolution of the voltage waveform of the AC power supply voltage to be measured. In this manner, since a decrease in the resolution of the voltage waveform of the AC power supply voltage to be measured by the contactless voltage measurement circuit 30 is suppressed, the power measurement apparatus 1 can accurately measure power.

20-2

The regulator 33 is preferably configured such that the magnitude of the output signal SO of the differential amplifier 32 obtained when the gain is regulated to the minimum is allowed to be smaller than one half of the magnitude of the output signal SO of the differential amplifier 32 obtained when the gain is regulated to the maximum. With such a configuration, even in a case where the input signal SI of the differential amplifier 32 greatly changes by a factor of two or more in response to a change in surrounding environment, the regulator 33 can keep the magnitude of the output signal SO of the differential amplifier 32 within a predetermined range.

20-3

In the contactless voltage measurement circuit 30 according to the third embodiment, the regulator 33 is constituted by the programmable resistor R3. The programmable resistor R3 changes a resistance value determining the gain of the differential amplifier 32 on the basis of the magnitude of the output signal SO of the differential amplifier 32. Accordingly, the programmable resistor R3 is configured such that a signal relating to the magnitude of the output signal SO is fed back to the programmable resistor R3 from the feedback circuit 40. With the use of the programmable resistor R3, the contactless voltage measurement circuit 30 can easily perform control to keep the magnitude of the output signal SO of the differential amplifier 32 within a predetermined range.

20-4

In the contactless voltage measurement circuit 30 according to the fourth embodiment, the regulator 33 is constituted by the programmable capacitor C4. The programmable capacitor C4 is a variable capacitor that changes a capacitance value determining the magnitude of the input signal SI of the input part 31 on the basis of the magnitude of the output signal SO of the differential amplifier 32. Accordingly, the programmable capacitor C4 is configured such that a signal relating to the magnitude of the output signal SO is fed back to the programmable capacitor C4 from the feedback circuit 40. With the use of the programmable capacitor C4, the contactless voltage measurement circuit 30 can easily perform control to keep the magnitude of the output signal SO of the differential amplifier 32 within a predetermined range.

20-5

In the contactless voltage measurement circuit 30 according to the fifth embodiment, the regulator 33 is constituted by the programmable resistor R3 and the programmable capacitor C4, The programmable resistor R3 and the programmable capacitor C4 are a variable resistor and a variable capacitor that change a resistance value determining the gain of the differential amplifier 32 and a capacitance value determining the magnitude of the input signal SI of the input part 31 on the basis of the magnitude of the output signal SO of the differential amplifier 32. Accordingly, the programmable resistor R3 and the programmable capacitor C4 are configured such that a signal relating to the magnitude of the output signal SO is fed back to the programmable resistor R3 and the programmable capacitor C4 from the feedback circuit 40. With the use of the programmable resistor R3 and the programmable capacitor C4, the contactless voltage measurement circuit 30 can easily perform control to keep the magnitude of the output signal SO of the differential amplifier 32 within a predetermined range.

While embodiments of the present disclosure have been described, it will be understood that forms and details can be changed in various ways without departing from the spirit and scope of the present disclosure as recited in the claims.

The invention claimed is:

1. A power measurement apparatus comprising:
 a voltage detector configured to
  detect in a contactless manner an alternating current (AC) voltage of a conductive path to which power is supplied from an AC power source having a magnitude of AC voltage that is regulated to be a predetermined value and
  output a first data signal regarding a voltage waveform of the AC voltage of the conductive path;
 a current detector configured to
  detect in a contactless manner an AC current flowing through the conductive path and
  output a second data signal regarding a current waveform of the AC current of the conductive path; and
 a power calculator configured to
  receive the first data signal and the second data signal and
  calculate active power of the conductive path from a product of a second instantaneous voltage and an instantaneous current of the current waveform indicated by the second data signal,
  the second instantaneous voltage being generated by converting a first instantaneous voltage of the voltage waveform indicated by the first data signal based on the predetermined value,
 the voltage detector including a probe, an input part, a differential amplifier, and a regulator,
  the probe including an electrode arranged so as not to come into contact with the conductive path, and the probe being configured to generate an impedance including a capacitive component between the conductive path and the electrode,
  the input part being connected to the probe, and the input part being configured to produce an input signal corresponding to a waveform of the AC voltage of the conductive path based on a potential of the electrode,
  the differential amplifier being configured to
   amplify the input signal produced by the input part and
   to output an output signal, the output signal being the first data signal, and the regulator being configured to
   regulate at least one of a gain of the differential amplifier and a magnitude of the input signal produced by the input part based on a magnitude of the output signal of the differential amplifier, and
   maintain the magnitude of the output signal of the differential amplifier within a predetermined range.

2. The power measurement apparatus according to claim 1, wherein
 the predetermined value is an effective value or a peak value of the AC voltage of the AC power source, and in calculation of the active power of the conductive path, the power calculator converts the first instantaneous voltage into the second instantaneous voltage based on a ratio of
  an effective value or a peak value indicated by the voltage waveform to
  the predetermined value.

3. The power measurement apparatus according to claim 1, wherein
 the conductive path includes a first electric wire and a second electric wire,
 the probe includes, as the electrode,
  a first electrode arranged so as not to come into contact with the first electric wire and
  a second electrode arranged so as not to come into contact with the second electric wire,
 the probe is configured to generate
  a first impedance including a capacitive component between the first electric wire and the first electrode, and
  a second impedance including a capacitive component between the second electric wire and the second electrode, and
 the input part is configured to produce an input signal corresponding to a waveform of a potential difference between the first electrode and the second electrode.

4. The power measurement apparatus according to claim 1, wherein
 the regulator is configured such that a magnitude of the output signal of the differential amplifier obtained when the gain is regulated to a minimum is smaller than one half of a magnitude of the output signal of the differential amplifier obtained when the gain is regulated to a maximum.

5. The power measurement apparatus according to claim 1, wherein
 the regulator is a programmable resistor programmed to change a resistance value determining the gain of the differential amplifier based on the magnitude of the output signal of the differential amplifier.

6. The power measurement apparatus according to claim 1, wherein
 the input part includes a voltage divider circuit connected to the electrode to divide the AC voltage of the conductive path, and
 the voltage divider circuit includes at least one of a variable capacitor and a variable resistor regulated by the regulator to change the magnitude of the input signal.

7. The power measurement apparatus according to claim 1, wherein
 the input part includes a voltage divider circuit connected to the electrode to divide the AC voltage of the conductive path,
 the voltage divider circuit includes at least one of a variable capacitor and a variable resistor regulated by the regulator to change the magnitude of the input signal,
 the regulator includes a programmable resistor programmed to change a resistance value determining the gain of the differential amplifier based on the magnitude of the output signal of the differential amplifier, and
 the regulator is configured to change the resistance value of the programmable resistor and a value of the at least one of the variable capacitor and the variable resistor based on the magnitude of the output signal of the differential amplifier.

8. A power measurement apparatus comprising:
a voltage detector configured to
   detect in a contactless manner an alternating current (AC) voltage of a conductive path to which power is supplied from an AC power source having a magnitude of AC voltage that is regulated to be a predetermined value and
   output a first data signal regarding a voltage waveform of the AC voltage of the conductive path;
a current detector configured to
   detect in a contactless manner an AC current flowing through the conductive path and
   output a second data signal regarding a current waveform of the AC current of the conductive path; and
a power calculator configured to
   receive the first data signal and the second data signal and
   calculate active power of the conductive path from a magnitude of an AC current of the current waveform indicated by the second data signal, the predetermined value, and a phase difference between a fundamental of the voltage waveform obtained from the first data signal and a fundamental of the current waveform obtained from the second data signal,
the voltage detector including a probe, an input part, a differential amplifier, and a regulator,
   the probe including: an electrode arranged so as not to come into contact with the conductive path, and the probe being configured to generate an impedance including a capacitive component between the conductive path and the electrode,
   the input part being connected to the probe, and the input part being configured to produce an input signal corresponding to a waveform of the AC voltage of the conductive path based on a potential of the electrode,
the differential amplifier being configured to
   amplify the input signal produced by the input part and to output an output signal, the output signal being the first data signal, and the regulator being configured to
   regulate at least one of a gain of the differential amplifier and a magnitude of the input signal produced by the input part based on a magnitude of the output signal of the differential amplifier, and
maintain the magnitude of the output signal of the differential amplifier within a predetermined range.

9. A power measurement method comprising:
detecting in a contactless manner a voltage waveform of an alternating current (AC) voltage of a conductive path to which power is supplied from an AC power source having a magnitude of AC voltage that is regulated to be a predetermined value;
detecting in a contactless manner a current waveform of an AC current flowing through the conductive path;
converting a first instantaneous voltage indicated by the voltage waveform based on the predetermined value to generate a second instantaneous voltage;
calculating active power of the conductive path from a product of the second instantaneous voltage and an instantaneous current indicated by the current waveform;
generating an impedance including a capacitive component between the conductive path and an electrode, the electrode being arranged so as not to come into contact with the conductive path;
producing an input signal corresponding to a waveform of the AC voltage of the conductive path based on a potential of the electrode;
amplifying the input signal with a differential amplifier;
outputting an output signal with the differential amplifier;
regulating at least one of a gain of the differential amplifier and a magnitude of the input signal based on a magnitude of the output signal of the differential amplifier; and
maintaining the magnitude of the output signal of the differential amplifier within a predetermined range.

10. A power measurement method comprising:
detecting in a contactless manner a voltage waveform of an alternating, current (AC) voltage of a conductive path to which power is supplied from an AC power source having a magnitude of AC voltage that is regulated to be a predetermined value;
detecting in a contactless manner a current waveform of an AC current flowing through the conductive path;
calculating a magnitude of the AC current from the current waveform;
calculating a phase difference between a fundamental of the current waveform and a fundamental of the voltage waveform;
calculating active power of the conductive path from the predetermined value, the magnitude of the AC current of the current waveform, and the phase difference between the fundamental of the current waveform and the fundamental of the voltage waveform;
generating an impedance including a capacitive component between the conductive path and an electrode, the electrode being arranged so as not to come into contact with the conductive path;
producing an input signal corresponding to a waveform of the AC voltage of the conductive path based on a potential of the electrode;
amplifying the input signal with a differential amplifier;
outputting an output signal with the differential amplifier;
regulating at least one of a gain of the differential amplifier and a magnitude of the input signal based on a magnitude of the output signal of the differential amplifier; and
maintaining the magnitude of the output signal of the differential amplifier within a predetermined range.

\* \* \* \* \*